US012334182B2

(12) United States Patent
Du et al.

(10) Patent No.: US 12,334,182 B2
(45) Date of Patent: Jun. 17, 2025

(54) PAGE BUFFER, MEMORY DEVICE, AND METHOD FOR PROGRAMMING THEREOF

(71) Applicant: YANGTZE MEMORY TECHNOLOGIES CO., LTD., Wuhan (CN)

(72) Inventors: Zhichao Du, Wuhan (CN); Yan Wang, Wuhan (CN); Daesik Song, Wuhan (CN); Yu Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 220 days.

(21) Appl. No.: 18/096,346

(22) Filed: Jan. 12, 2023

(65) Prior Publication Data

US 2023/0290388 A1 Sep. 14, 2023

Related U.S. Application Data

(63) Continuation of application No. PCT/CN2022/140559, filed on Dec. 21, 2022.

(30) Foreign Application Priority Data

Mar. 14, 2022 (CN) ........................ 202210248481.2

(51) Int. Cl.
*G11C 7/00* (2006.01)
*G11C 7/10* (2006.01)
*G11C 7/12* (2006.01)

(52) U.S. Cl.
CPC .......... *G11C 7/1039* (2013.01); *G11C 7/1063* (2013.01); *G11C 7/12* (2013.01)

(58) Field of Classification Search
CPC ........................................................ G11C 7/12
(Continued)

(56) References Cited

U.S. PATENT DOCUMENTS

2008/0158953 A1 7/2008 Wang et al.
2010/0142277 A1 6/2010 Yang et al.
(Continued)

FOREIGN PATENT DOCUMENTS

CN 108091365 A 5/2018
CN 108399935 A 8/2018
(Continued)

OTHER PUBLICATIONS

International Search Report issued in corresponding International Application No. PCT/CN2022/140559, mailed Mar. 13, 2023, 3 pages.

*Primary Examiner* — Hoai V Ho
(74) *Attorney, Agent, or Firm* — BAYES PLLC

(57) ABSTRACT

A page buffer includes a first charge/discharge circuit and a second charge/discharge circuit coupled to a bit line. The first charge/discharge circuit is configured to store first bit line forcing information and apply a first bit line forcing voltage to the bit line based on the first bit line forcing information. The second charge/discharge circuit coupled to the bit line and configured to store a second bit line forcing information, and apply a second bit line forcing voltage, different from the first bit line forcing voltage, to the bit line based on the second bit line forcing information. The first bit line forcing voltage and the second bit line forcing voltage are both higher than a programming bit line voltage and lower than a programming-inhabit bit line voltage.

20 Claims, 14 Drawing Sheets

(58) Field of Classification Search
USPC .................................................... 365/189.05
See application file for complete search history.

(56) References Cited

U.S. PATENT DOCUMENTS

| | | | | |
|---|---|---|---|---|
| 2010/0329005 | A1 | 12/2010 | Yang | |
| 2012/0026797 | A1* | 2/2012 | Kim ...................... | G11C 16/24 365/185.18 |
| 2017/0117024 | A1 | 4/2017 | Amarnath et al. | |
| 2020/0321058 | A1 | 10/2020 | Lee et al. | |
| 2021/0295927 | A1 | 9/2021 | Park et al. | |

FOREIGN PATENT DOCUMENTS

| | | | |
|---|---|---|---|
| CN | 112750487 | A | 5/2021 |
| CN | 113409848 | A | 9/2021 |
| CN | 114168491 | A | 3/2022 |
| CN | 114783488 | A | 7/2022 |
| KR | 20100022228 | A | 3/2010 |

* cited by examiner

PAGE BUFFER, MEMORY DEVICE, AND METHOD FOR PROGRAMMING THEREOF

CROSS-REFERENCE TO RELATED APPLICATIONS

This application is a continuation of International Application No. PCT/CN2022/140559, filed on Dec. 21, 2022, entitled "PAGE BUFFER, MEMORY DEVICE, AND METHOD FOR PROGRAMMING THEREOF," which claims the benefit of priority to Chinese Application No. 202210248481.2, filed on Mar. 14, 2022, both of which are incorporated herein by reference in their entireties.

BACKGROUND

The present disclosure relates to a page buffer, a memory device, and a method for programming thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, a program operation and or read operation can be performed at the page.

SUMMARY

In one aspect, a page buffer includes a first charge/discharge circuit and a second charge/discharge circuit coupled to a bit line. The first charge/discharge circuit is configured to store first bit line forcing information and apply a first bit line forcing voltage to the bit line based on the first bit line forcing information. The second charge/discharge circuit coupled to the bit line and configured to store a second bit line forcing information, and apply a second bit line forcing voltage, different from the first bit line forcing voltage, to the bit line based on the second bit line forcing information. The first bit line forcing voltage and the second bit line forcing voltage are both higher than a programming bit line voltage and lower than a programming-inhabit bit line voltage.

In some implementations, the first bit line forcing voltage is higher than the second bit line forcing voltage.

In some implementations, the first charge/discharge circuit includes a first latch, a first charge/discharge circuit, and a first bit line voltage setting circuit. The first latch is coupled to the bit line through the page buffer and a first sense node coupled to a first charge/discharge circuit, configured to store the first bit line forcing information. The first charge/discharge circuit is coupled to the bit line through the page buffer and a second sense node coupled to a first bit line voltage setting circuit and is configured to drive a supply voltage to a first bit line voltage setting circuit. The first bit line voltage setting circuit is coupled to the bit line through the second sense node and the first charge/discharge circuit and is configured to drive the first bit line forcing voltage to the second sense node according to the first bit line forcing information.

In some implementations, the first charge/discharge circuit includes a first charging switch, coupled to the supply voltage and the first bit line voltage setting circuit, configured to drive the supply voltage to the first bit line voltage setting circuit according to a signal output by the first latch; and a control terminal of the first charging switch is coupled to the first latch.

In some implementations, the first latch includes: a first data latching circuit configured to store verification information corresponding to a verified result, or to store the first bit line forcing information; and a first data setting circuit, coupled to the first data latching circuit, configured to send the verification information to be stored or the first bit line forcing information to be stored to the first data latching circuit.

In some implementations, the second charge/discharge circuit includes a second latch, a second charge/discharge circuit, and a second bit line voltage setting circuit. The second latch is coupled to the bit line through a second charge/discharge circuit and a first sense node coupled to the page buffer and is configured to store the second bit line forcing information. The second charge/discharge circuit is coupled to the bit line through the page buffer and the first sense node coupled to a second bit line voltage setting circuit and is configured to drive a supply voltage to a second bit line voltage setting circuit. The second bit line voltage setting circuit is coupled to the bit line through the second charge/discharge circuit and a second sense node of the page buffer and is configured to drive the second bit line forcing voltage to the second sense node according to the second bit line forcing information.

In some implementations, the second charge/discharge circuit includes a second charging switch, coupled to the supply voltage and the second bit line voltage setting circuit, configured to drive the supply voltage to the second bit line voltage setting circuit according to a signal output by the second latch; and a control terminal of the second charging switch is coupled to the second latch.

In some implementations, the second latch includes: a second data latching circuit configured to store verification information corresponding to a verified result, or to store the second bit line forcing information; and a second data setting circuit, coupled to the second data latching circuit, configured to send the verification information to be stored or the second bit line forcing information to be stored to the second data latching circuit.

In some implementations, the first charge/discharge circuit is configured to store verification information and drive the programming bit line voltage to the bit line when the verification information allows programming; and the page buffer includes a dynamic latch, coupled to a first sense node of the page buffer, configured to store and send the first bit line forcing information to the first charge/discharge circuit after the programming bit line voltage is applied to the bit line by the first charge/discharge circuit.

In some implementations, the dynamic latch includes: a third data latching circuit configured to store the first bit line forcing information; and a third data setting circuit, coupled to the third data latching circuit, configured to send the first bit line forcing information to the third data latching circuit.

In some implementations, the first charge/discharge circuit is configured to apply the programming-inhabit bit line voltage to the bit line when the verification information prohibits programming.

In another aspect, a memory device includes a memory cell array including a plurality of memory cells and a plurality of bit lines coupled to the plurality of memory cells; and a peripheral circuit, coupled to the memory cell array, configured to control the memory cell array, the peripheral circuit including a page buffer. The page buffer includes a first charge/discharge circuit and a second charge/discharge circuit. The first charge/discharge circuit coupled to the bit line and configured to store first bit line forcing information and apply a first bit line forcing voltage to the bit line based on the first bit line forcing information. The second charge/discharge circuit coupled to the bit line and configured to store a second bit line forcing information, and apply a second bit line forcing voltage, different from the first bit line forcing voltage, to the bit line based on the second bit line forcing information. The first bit line forcing voltage and the second bit line forcing voltage are both higher than a programming bit line voltage and lower than a programming-inhabit bit line voltage.

In some implementations, the first bit line forcing voltage is higher than the second bit line forcing voltage.

In some implementations, the first charge/discharge circuit includes a first latch, a first charge/discharge circuit, and a first bit line voltage setting circuit. The first latch is coupled to the bit line through the page buffer and a first sense node coupled to a first charge/discharge circuit and is configured to store the first bit line forcing information. The first charge/discharge circuit is coupled to the bit line through the page buffer and a second sense node coupled to a first bit line voltage setting circuit and is configured to drive a supply voltage to a first bit line voltage setting circuit. The first bit line voltage setting circuit is coupled to the bit line through the second sense node and the first charge/discharge circuit and is configured to drive the first bit line forcing voltage to the second sense node according to the first bit line forcing information stored.

In some implementations, the first charge/discharge circuit includes a first charging switch, coupled to the supply voltage and the first bit line voltage setting circuit, configured to drive the supply voltage to the first bit line voltage setting circuit according to a signal output by the first latch; and a control terminal of the first charging switch is coupled to the first latch.

In some implementations, the first latch includes: a first data latching circuit configured to store verification information corresponding to a verified result, or to store the first bit line forcing information; and a first data setting circuit, coupled to the first data latching circuit, configured to send the verification information to be stored or the first bit line forcing information to be stored to the first data latching circuit.

In some implementations, the second charge/discharge circuit includes: a second latch, a second charge/discharge circuit, and a second bit line voltage setting circuit. The second latch is coupled to the bit line through a second charge/discharge circuit and a first sense node coupled to the page buffer and is configured to store the second bit line forcing information. The second charge/discharge circuit is coupled to the bit line through the page buffer and the first sense node coupled to a second bit line voltage setting circuit and is configured to drive a supply voltage to a second bit line voltage setting circuit. The second bit line voltage setting circuit is coupled to the bit line through the second charge/discharge circuit and a second sense node of the page buffer and is configured to drive the second bit line forcing voltage to the second sense node according to the second bit line forcing information.

In some implementations, the second charge/discharge circuit includes a second charging switch, coupled to the supply voltage and the second bit line voltage setting circuit, configured to drive the supply voltage to the second bit line voltage setting circuit according to a signal output by the second latch; and a control terminal of the second charging switch is coupled to the second latch.

In some implementations, the second latch includes a second data latching circuit configured to store verification information corresponding to a verified result, or to store the second bit line forcing information; and a second data setting circuit, coupled to the second data latching circuit, configured to send the verification information to be stored or the second bit line forcing information to be stored to the second data latching circuit.

In some implementations, the first charge/discharge circuit is configured to store verification information and drive the programming bit line voltage to the bit line when the verification information allows programming; and the page buffer includes a dynamic latch, coupled to a first sense node of the page buffer, configured to store and send the first bit line forcing information to the first charge/discharge circuit after the programming bit line voltage is applied to the bit line by the first charge/discharge circuit.

In some implementations, the dynamic latch includes: a third data latching circuit configured to store the first bit line forcing information; and a third data setting circuit, coupled to the third data latching circuit, configured to send the first bit line forcing information to the third data latching circuit.

In some implementations, the first charge/discharge circuit is configured to apply the programming-inhabit bit line voltage to the bit line when the verification information prohibits programming.

In yet another aspect, a method for operating a memory device, including: applying a first bit line forcing voltage to a bit line coupled to a memory cell to be programmed according to a first bit line forcing information stored in a first charge/discharge circuit; applying a second bit line forcing voltage to the bit line according to second bit line forcing information stored in a second charge/discharge circuit; and programming the memory cell by the first bit line forcing voltage and/or the second bit line forcing voltage. The first bit line forcing voltage and the second bit line forcing voltage are both higher than a programming bit line voltage and lower than a programming-inhabit bit line voltage.

In some implementations, the first bit line forcing voltage is higher than the second bit line forcing voltage.

In some implementations, applying a first bit line forcing voltage to the bit line includes: storing the first bit line forcing information in a first latch of the first charge/discharge circuit after performing a first bit line sensing voltage verification on the memory cell to be programmed; applying a supply voltage to a first bit line voltage setting circuit of the first charge/discharge circuit through a first charge/discharge circuit of the first charge/discharge circuit; and applying the first bit line forcing voltage to a second sense node coupled to the bit line based on the supply voltage, according to the first bit line forcing voltage, by the first bit line voltage setting circuit.

In some implementations, applying a supply voltage to a first bit line voltage setting circuit of the first charge/discharge circuit through a first charge/discharge circuit of the first charge/discharge circuit includes: applying the supply voltage to the first bit line voltage setting circuit by a first charging switch of the first charge/discharge circuit according to a signal sent by the first latch.

In some implementations, applying a second bit line forcing voltage to the bit line includes: storing the second bit line forcing information in a second latch of the second charge/discharge circuit after performing a second bit line sensing voltage verification on the memory cell to be programmed; applying a supply voltage to a second bit line voltage setting circuit of the second charge/discharge circuit through a second charge/discharge circuit of the second charge/discharge circuit; and applying the second bit line forcing voltage to a second sense node coupled to the bit line based on the supply voltage, according to the second bit line forcing voltage, by the second bit line voltage setting circuit.

In some implementations, applying a supply voltage to a second bit line voltage setting circuit of the second charge/discharge circuit through a second charge/discharge circuit of the second charge/discharge circuit includes: applying the supply voltage to the second bit line voltage setting circuit by a second charging switch of the second charge/discharge circuit according to a signal sent by the second latch.

In some implementations, the method further includes storing a verification information into the first charge/discharge circuit; applying the programming bit line voltage to the bit line when the verification information allows programming; and sending the first bit line forcing information to the first charge/discharge circuit after providing the programming bit line voltage to the bit line by the first charge/discharge circuit.

In some implementations, the method further includes providing the programming-inhabit bit line voltage to the bit line when the verification information prohibits programming.

In some implementations, the programming bit line voltage is a ground voltage; and the programming-inhabit bit line voltage is a supply voltage.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Aspects of the present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Non-volatile storage cells, such as flash memory cells, can perform programming and erasing operations by threshold voltages that vary when electrons are migrated under a strong electric field applied to a thin oxide layer. When a programming operation is performed on a Flash memory, the threshold voltages of a plurality of memory cells are programmed to different values. The threshold voltages are distributed with a certain degree of variation, and margins are set between adjacent scopes of threshold voltages for read operations. A wide distribution of threshold voltages results in narrow margins, and the performance of the memory device will be deteriorated due to narrow read margins.

To address one or more aforementioned issues, the present disclosure introduces a solution in which two charge/discharge circuits are configured to provide two types of bit line forcing voltages to make it slow and difficult to change the threshold voltages of corresponding memory cells during programming. The bit line forcing voltages are distinguished from a programming-inhabit bit line voltage and a programming bit line voltage, the former prohibits programming by charging the bit line with a high voltage, and the latter allows programming by discharging the bit line with a low voltage.

A memory cell is applied with a bit line forcing voltage will not be prohibited from programming, and the bit line forcing voltage will make it difficult and slow for the threshold voltage form varying. The higher the bit line forcing voltage, the more difficult it is to charge the corresponding memory cell during the programming process. Therefore, applying different bit line forcing voltages to different bit lines during programming can achieve fine programming and narrow the threshold voltage distribution.

Figure 1A:
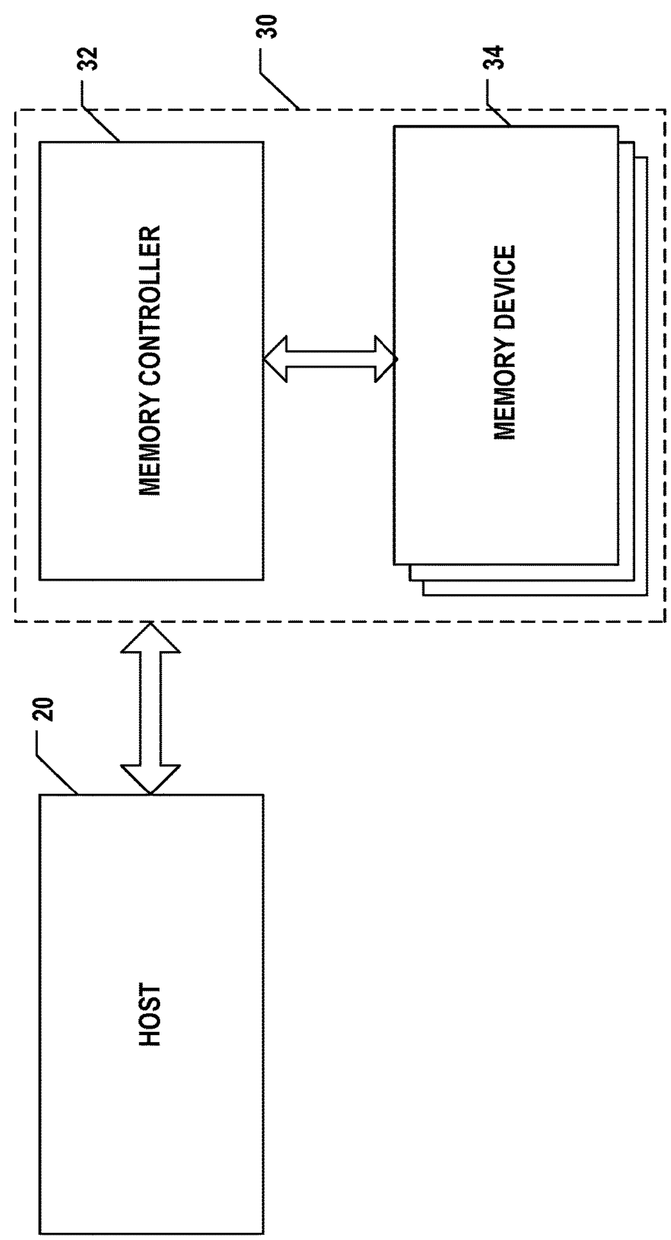
FIG. 1A illustrates a block diagram of an exemplary system having a memory device, according to some aspects of the present disclosure.

FIG. 1A illustrates a block diagram of an exemplary system 10 having a host 20 and a memory system 30, according to some aspects of the present disclosure. System 10 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 10 can include a host 20 and a memory system 30 having one or more memory devices 34 and a memory controller 32. Host 20 can be a processor of an electronic device, such as a central processing unit (CPU), or a system-on-chip (SoC), such as an application processor (AP). Host 20 can be configured to send or receive data to or from memory system 30.

Memory device 34 can be any memory device disclosed in the present disclosure, such as NAND Flash Memory, Vertical NAND flash memory, Dynamic Random Access Memory (DRAM), Ferroelectric Random Access Memory (FRAM), Magneto resistive Random Access Memory (MRAM), Phase Change Random Access Memory (PCRAM), Resistive Random Access Memory (RRAM), Nano Random Access Memory (NRAM), and so on.

Memory controller 32 is coupled to memory device 34 and host 20 and is configured to control memory device 34, according to some implementations. Memory controller 32 can manage the data stored in memory device 34 and communicate with host 20. In some implementations, memory controller 32 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 32 is designed for operating in a high duty-cycle environment SSDs or embedded multi-media-cards (eMMCs) used as data storage for mobile devices, such as smartphones, tablets, laptop computers, etc., and enterprise storage arrays. Memory controller 32 can be configured to control operations of memory device 34, such as read, erase, and program operations. Memory controller 32 can also be configured to manage various functions with respect to the data stored or to be stored in memory device 34 including, but not limited to bad-block management, garbage collection, logical-to-physical address conversion, wear leveling, etc. In some implementations, memory controller 32 is further configured to process error correction codes (ECCs) with respect to the data read from or written to memory device 34. Any other suitable functions may be performed by memory controller 32 as well, for example, formatting memory device 34. Memory controller 32 can communicate with an external device (e.g., host 20) according to a particular communication protocol. For example, memory controller 32 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1B:
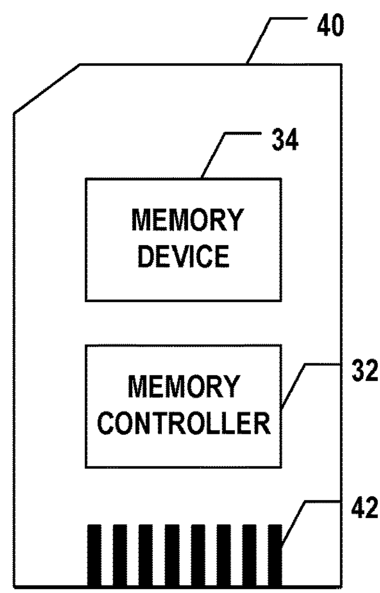
FIG. 1B illustrates a diagram of an exemplary memory card having a memory device, according to some aspects of the present disclosure.
Figure 1C:
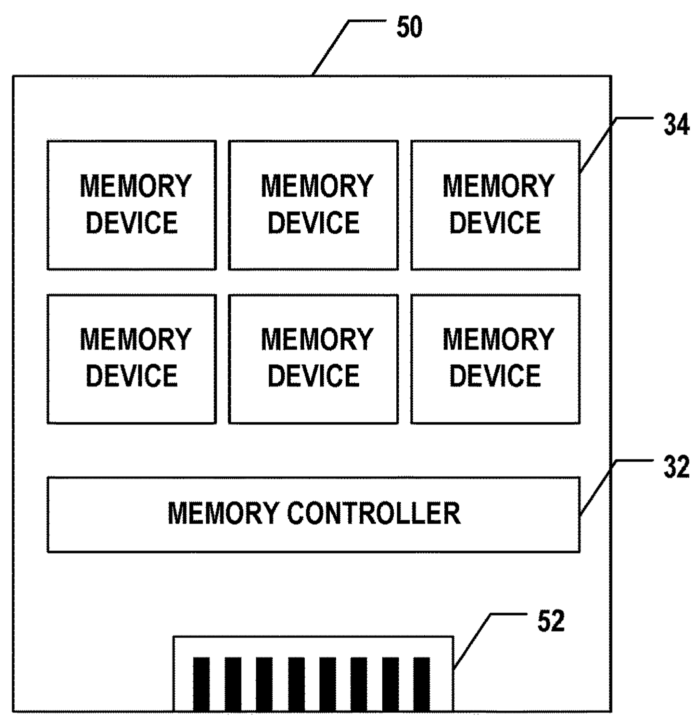
FIG. 1C illustrates a diagram of an exemplary solid-state drive (SSD) having a memory device, according to some aspects of the present disclosure.

Memory controller 32 and one or more memory devices 34 can be integrated into various types of storage devices, for example, be included in the same package, such as a universal Flash storage (UFS) package or an eMMC package. That is, memory system 30 can be implemented and packaged into different types of end electronic products. In one example as shown in FIG. 1B, memory controller 32 and a single memory device 34 may be integrated into a memory card 40. Memory card 40 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 40 can further include a memory card connector 42 coupling memory card 40 with a host (e.g., host 20 in FIG. 1). In another example as shown in FIG. 1C, memory controller 32 and multiple memory devices 34 may be integrated into an SSD 50. SSD 50 can further include an SSD connector 52 coupling SSD 50 with a host (e.g., host 20 in FIG. 1A). In some implementations, the storage capacity and/or the operation speed of SSD 50 is higher than those of memory card 40.

Figure 1D:
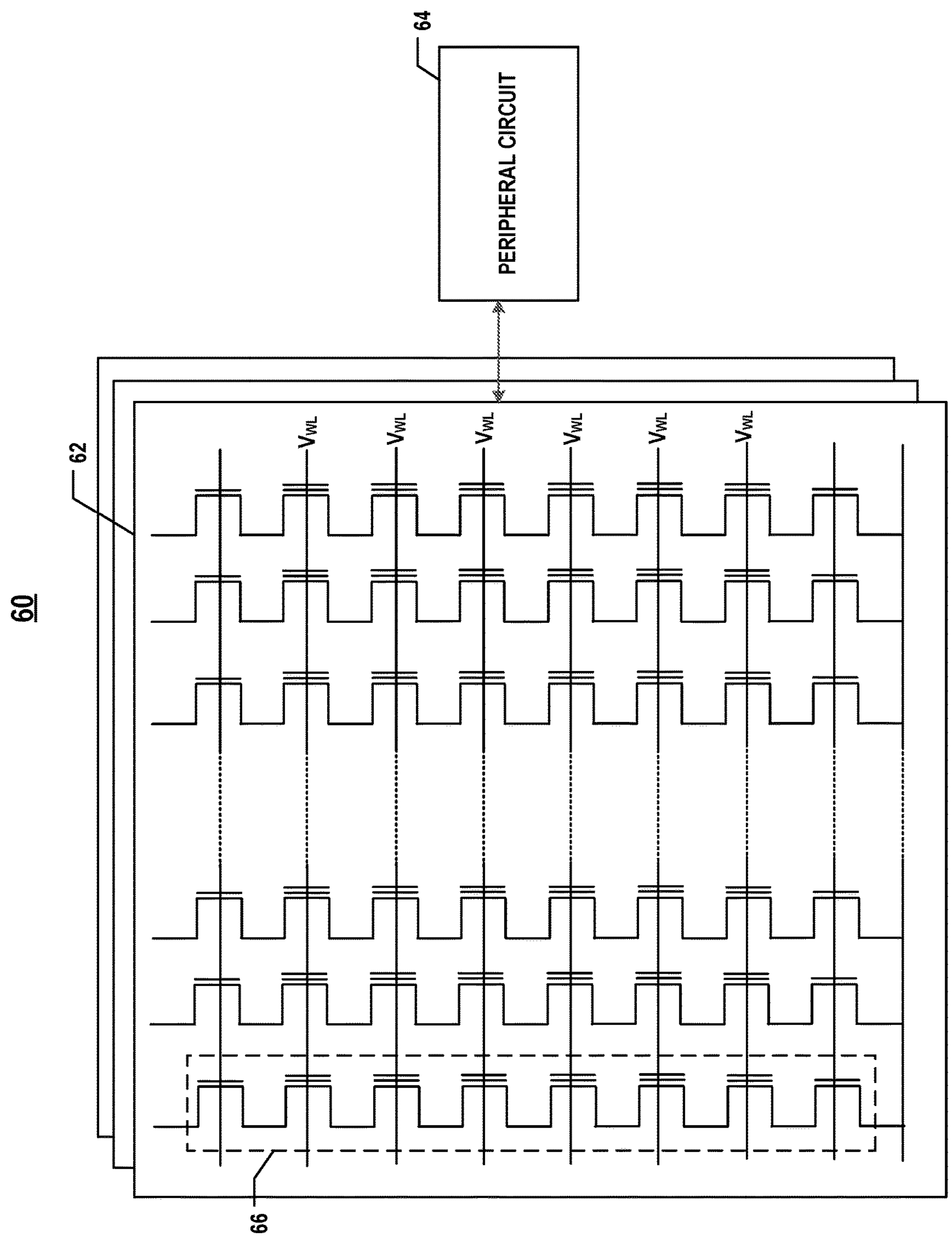
FIG. 1D illustrates a schematic diagram of an exemplary memory device including peripheral circuits, according to some aspects of the present disclosure.

FIG. 1D illustrates a schematic circuit diagram of an exemplary memory device 60 including peripheral circuits, according to some aspects of the present disclosure. Memory device 60 can be an example of memory device 34 in FIG. 1A. Memory device 60 can include a memory cell array 62 and peripheral circuits 64 coupled to memory cell array 62. Memory cell array 62 can be a NAND Flash memory cell array in which memory cells are provided in the form of an array of NAND memory strings 66 each extending vertically above a substrate (not shown). In some implementations, each NAND memory string 66 includes a plurality of memory cells coupled in series and stacked vertically. Each memory cell can hold a continuous, analog value, such as an electrical voltage or charge, that depends on the number of electrons trapped within a region of the memory cell. Each memory cell can be either a floating gate type of memory cell including a floating-gate transistor or a charge trap type of memory cell including a charge-trap transistor.

In some implementations, each memory cell is a single-level cell (SLC) that has two possible memory states and thus, can store one bit of data. For example, the first memory state "0" can correspond to a first range of voltages, and the second memory state "1" can correspond to a second range of voltages. In some implementations, each memory cell is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

Figure 1E:
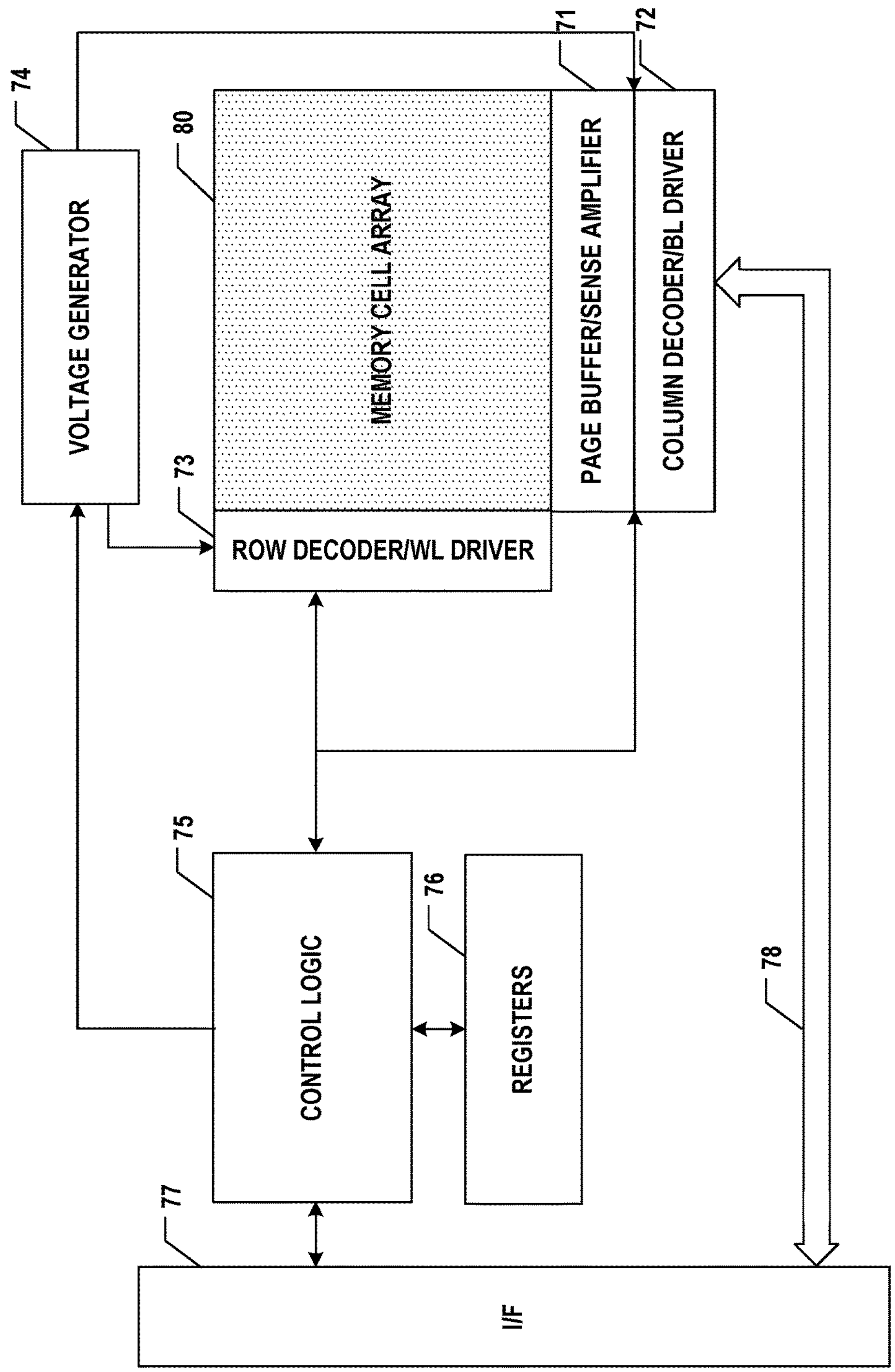
FIG. 1E illustrates a block diagram of an exemplary memory device including a memory cell array and peripheral circuits, according to some aspects of the present disclosure.

As shown in FIG. 1D, the peripheral circuit can couple to the memory cell array through a bit line (BL), a word line (WL), a source select gate (SSG), and a drain select gate (DSG). The peripheral circuitry may include any suitable analog, digital, and mixed-signal circuitry for facilitating the associated operation of the array of memory cells by applying voltage signals and/or current signals to and sensing voltage signals and/or current signals from each target memory cell via a bit line, word line, source, SSG, or DSG, etc. In addition, the peripheral circuits may include various types of peripheral circuits formed using metal-oxide-semiconductor (MOS) technology. Referring to FIG. 1E, peripheral circuit 64 includes a Page Buffer (PB)/sense amplifier 71, a column decoder/bit line driver 72, a row decoder/word line driver 73, a voltage generator 74, a control logic 75, registers 76, an interface 77, and a data bus 78. It should be understood that the above peripheral circuitry 70 may be the same as the peripheral circuit 64 in FIG. 1D and in some other examples, peripheral circuitry 70 may also include additional peripheral circuitry not shown in FIG. 1E.

Page buffer/sense amplifier 71 can be configured to read and program (write) data from and to memory cell array 62 according to the control signals from control logic 75. In one example, page buffer/sense amplifier 71 may store one page of program data (write data) to be programmed into one page of memory cell array 62. In another example, page buffer/sense amplifier 71 may perform program verify operations to ensure that the data has been properly programmed into memory cells coupled to selected word lines. In still another example, page buffer/sense amplifier 71 may also sense the low power signals from bit line that represents a data bit stored in memory cell and amplify the small voltage swing to recognizable logic levels in a read operation. Column decoder/bit line driver 72 can be configured to be controlled by control logic 75 and select one or more NAND memory strings 66 by applying bit line voltages generated from voltage generator 74.

Row decoder/word line driver 73 can be configured to be controlled by control logic 75 and select/deselect blocks 62 of memory cell array 62 and select/deselect word lines of block 62. Row decoder/word line driver 73 can be further configured to drive word lines using word line voltages generated from voltage generator 74. In some implementations, row decoder/word line driver 73 can also select/deselect and drive SSG lines and DSG lines as well. As described below in detail, row decoder/word line driver 73 is configured to apply a read voltage to selected word line in a read operation on memory cell coupled to selected word line.

Voltage generator 74 can be configured to be controlled by control logic 75 and generate the word line voltages (e.g., read voltage, program voltage, pass voltage, local voltage, verification voltage, etc.), bit line voltages, and source line voltages to be supplied to memory cell array 62.

Control logic 75 can be coupled to each peripheral circuit described above and configured to control operations of each peripheral circuit. Registers 76 can be coupled to control logic 75 and include status registers, command registers, and address registers for storing status information, command operation codes (OP codes), and command addresses for controlling the operations of each peripheral circuit.

Interface 77 can be coupled to control logic 75 and act as a control buffer to buffer and relay control commands received from a host (not shown) to control logic 75 and status information received from control logic 75 to the host. Interface 77 can also be coupled to column decoder/bit line driver 72 via data bus 78 and act as a data input/output (I/O) interface and a data buffer to buffer and relay the data to and from memory cell array 62.

Figure 1F:
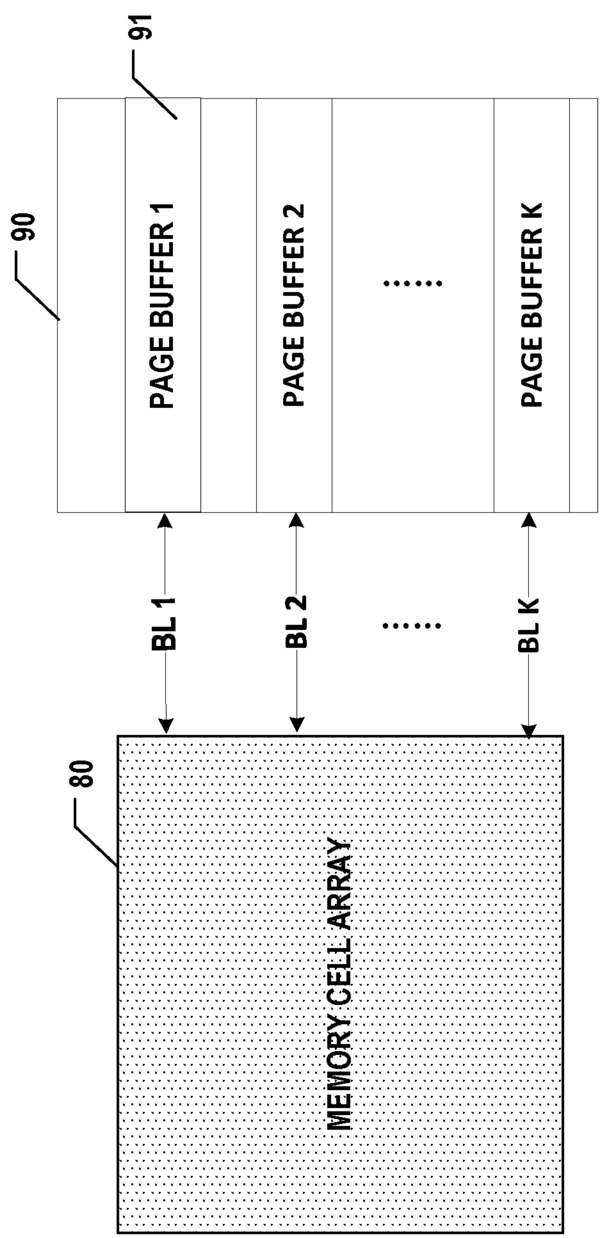
FIG. 1F illustrates a block diagram of an exemplary memory device including a page buffer, according to some aspects of the present disclosure.

As shown in FIG. 1F, a page buffer bank 90 is illustrated. Page buffer bank 90 is coupled to memory cell array 80 via a plurality of bit lines BL1 through BLk. Page buffer bank 90 includes page buffers 1 (PB1) through page buffers k (PBk), each of the page buffers is coupled to the memory cell array via a corresponding bit line. For example, page buffers PB1 through PBk may be coupled to the memory cell array via corresponding bit lines BL1 through BLk, respectively.

Figure 2:
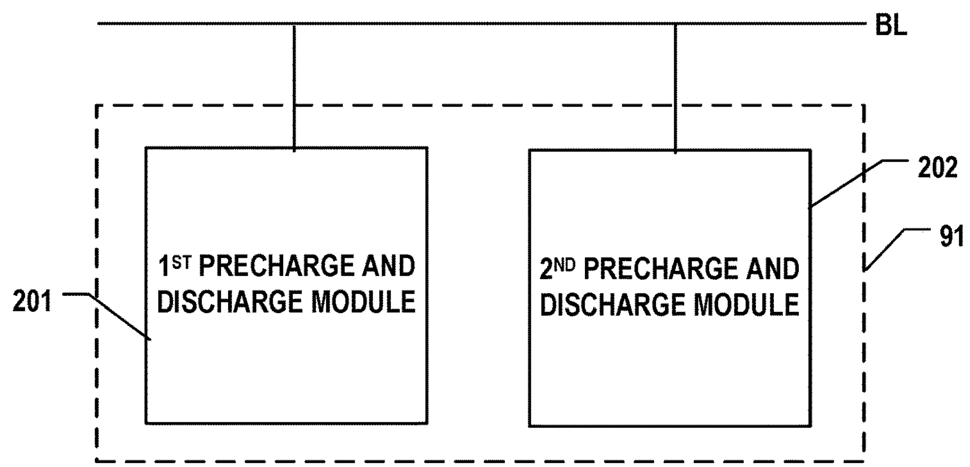
FIG. 2 illustrates a block diagram of an exemplary page buffer, according to some aspects of the present disclosure.

Referring to FIG. 2, a page buffer corresponding to bit lines of a memory cell array of a memory device is provided. The page buffer includes a first charge/discharge circuit and a second charge/discharge circuit.

The first charge/discharge circuit, coupled to a bit line, is configured to store a first bit line forcing information and apply a first bit line forcing voltage to the bit line according to the first bit line forcing information.

The second charge/discharge circuit, coupled to the bit line, is configured to store a second bit line forcing information and apply a second bit line forcing voltage to the bit line according to the second bit line forcing information. Both the first bit line forcing voltage and second bit line forcing voltage are higher than the programming bit line voltage and smaller than the programming-inhabit bit line voltage.

FIG. 2 depicts a page buffer 91 from the page buffers PB1 through PBk shown in FIG. 1F as an example. It should be noted that the remaining page buffers have the same configuration as page buffer 91. In some examples, page buffer 91 has a charge/discharge circuit configured to adjust to the bit line voltage during programming, for example, applying a voltage to the bit line to pre-charge the bit line, or discharge the bit line to pull the bit line voltage down to ground voltage, etc.

During programming, programming-inhabit bit line voltages and programming bit line voltages can be applied to a bit line corresponding to memory cells through a charge/discharge circuit. For example, a high voltage can be applied to the bit line through a charging function of the charge/discharge circuit to inhabit programming, and a grand voltage can be applied to the bit line through a discharging function of the charge/discharge circuit to allow programming. However, the distribution of the threshold voltages of the memory cells in a memory page cannot be narrowed by the application of the programming-inhabit bit line voltages and programming bit line voltages.

The present disclosure introduces a solution in which two charge/discharge circuits are configured to provide two types of bit line forcing voltages to make it slow and difficult to change the threshold voltages of corresponding memory cells during programming. The bit line forcing voltages are distinguished from a programming-inhabit bit line voltage and a programming bit line voltage, the former prohibits programming by charging the bit line with a high voltage, and the latter allows programming by discharging the bit line with a low voltage. A memory cell is applied with a bit line forcing voltage will not be prohibited from programming, and the bit line forcing voltage will make it difficult and slow for the threshold voltage form varying. The higher the bit line forcing voltage, the more difficult it is to charge the corresponding memory cell during programming process. Therefore, applying different bit line forcing voltages to different bit lines during programming can achieve fine programming and narrow the threshold voltage distribution.

Referring to FIG. 2, page buffer 91 includes a first charge/discharge circuit 201 and a second charge/discharge circuit 202. First charge/discharge circuit 201, is coupled to a bit line, and configured to store a first bit line forcing voltage and apply a first bit line forcing voltage to the bit line according to the first bit line forcing information. Second charge/discharge circuit 202, is coupled to a bit line, and configured to store a second bit line forcing voltage and apply a second bit line forcing voltage to the bit line according to the second bit line forcing information. Two charge/discharge circuits are employed in the present disclosure to provide two different types of bit line forcing voltages based on the level of programming refinement, i.e., first bit line forcing voltage and second bit line forcing voltage, to balance the speed and refinement level of programming operations. If the threshold voltage of a memory cell to be programmed has a large gap with the target threshold voltage, then a smaller bit line forcing voltage will be applied to raise the threshold voltage of the memory cell quickly. If the threshold voltage of the memory cell to be programmed is close to the target threshold voltage, then a relatively large bit line forcing voltage will be applied so that the threshold voltage rises slightly but not too much to avoid over-programming. In this way, when bit lines coupled to different memory cells on a page are applied with different bit line forcing voltages and the corresponding word lines are applied with the same programming bit line voltage, different memory cells can be programmed to different degrees and can be programmed more consistently to the data state corresponding to a certain threshold range.

The first bit line forcing information is configured to distinguish the information of memory cells to perform a first bit line forcing operation, i.e., information distinguishing between memory cells to perform a first bit line forcing operation and memory cells not to perform a first bit line forcing operation. The first bit line forcing information can be indicated by the binary data “0” or “1” to indicate whether the first bit line forcing operation is to be performed or not. The second bit line forcing information is configured to distinguish information of memory cells to perform a second bit line forcing operation, i.e., information distinguishing between memory cells to perform a second bit line forcing operation and memory cells not to perform a second bit line forcing operation. The second bit line forcing information can be indicated by the binary data “0” or “1” to indicate whether the second bit line forcing operation is to be performed or not.

Two charge/discharge circuits are set in page buffer 91 to provide two extra bit line forcing voltages during programming operations, so that the programming degrees can be configured flexibly to obtain a narrow threshold voltage distribution and wide margins, thereby improving the stability and accuracy of the memory device.

In some examples of the present disclosure, more than two charge/discharge circuits are configured to provide more than two different bit line forcing voltages to obtain a fine programming degree.

In some examples of the present disclosure, the programming-inhabit bit line voltage is applied to a bit line corresponding to a memory cell to be prohibited from being programmed, for prohibiting the memory cell from being programmed. The programming bit line voltage is applied to a bit line corresponding to a memory cell to be programmed for a first programming. The first bit line forcing voltage is applied to a bit line corresponding to a memory cell to be programmed for a second programming. The second bit line forcing voltage is applied to a bit line corresponding to a memory cell to be programmed for a third programming. A degree of the first programming is higher than a degree of the second programming, and the degree of the second programming is higher than a degree of the third programming.

The programming-inhabit bit line voltage Vinh can be a supply voltage VDD and is applied to the bit line corresponding to the memory cell being inhabited form being programmed. The programming bit line voltage Vprog may be a ground voltage Vss and is applied on the bit line corresponding to the memory cell to be programmed to perform the first programming.

The first bit line forcing voltage can be a voltage between the supply voltage VDD and the ground voltage Vss, the first bit line forcing voltage being applied to the bit line corresponding to the memory cell to be programmed to perform the second programming. The degree of the first programming is higher than the degree of the second programming, i.e., applying the programming bit line voltage to a memory cell to be programmed increases the threshold voltage faster than applying the first bit line forcing voltage to it.

The second bit line forcing voltage can be a voltage between the supply voltage VDD and the ground voltage Vss, and the second bit line forcing voltage is higher than the first bit line forcing voltage. The second bit line forcing voltage is applied to the bit line corresponding to the memory cell to be programmed to perform the third programming. The degree of the second programming is higher than the degree of the third programming, i.e., applying the first bit line forcing voltage to a memory cell to be programmed increases the threshold voltage faster than applying the second bit line forcing voltage to it.

Figure 3:
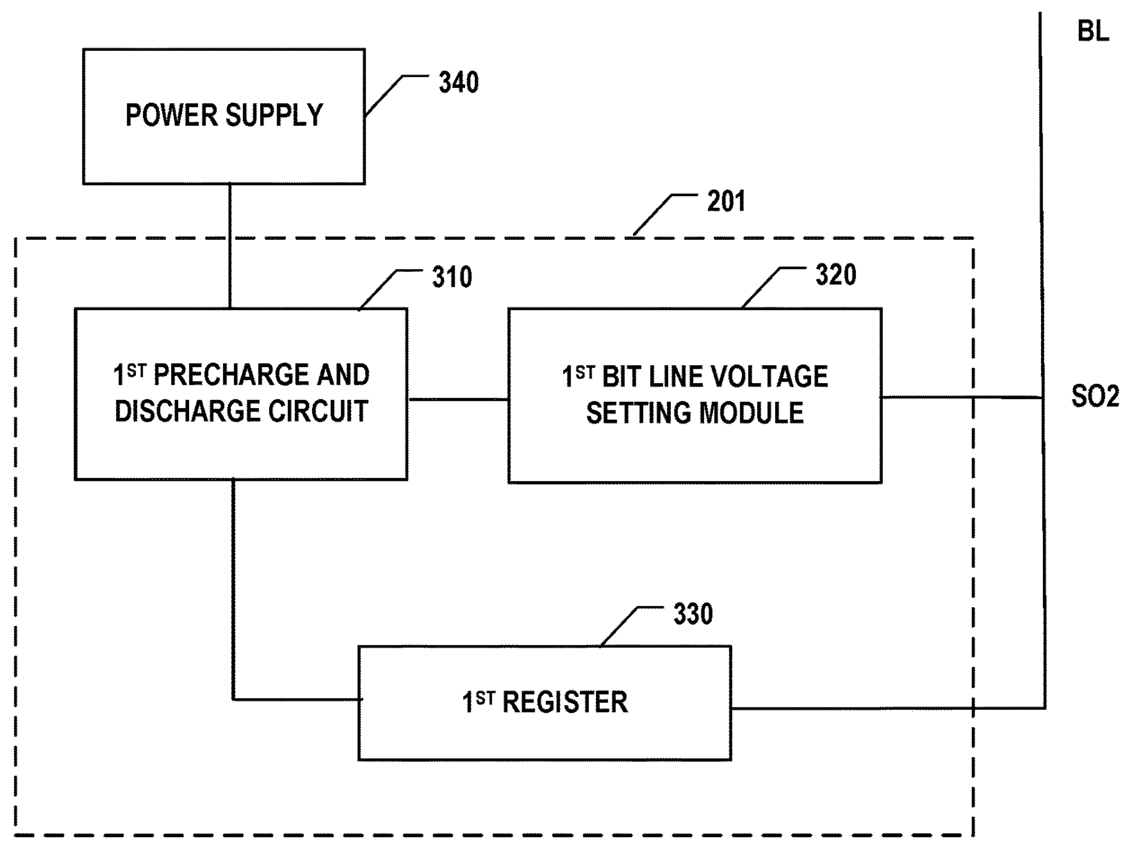
FIG. 3 illustrates a block diagram of an exemplary charge and discharge circuit of the page buffer, according to some aspects of the present disclosure.

Referring to FIG. 3, the first charge/discharge circuit 201 includes a first charge/discharge circuit 310, a first latch 330, and a first bit line voltage setting circuit 320. The first charge/discharge circuit 310 is coupled to the supply voltage and coupled to a second sense node SO2 of the page buffer to connect to the bit line via first bit line voltage setting circuit 320. First charge/discharge circuit 310 is configured to apply the supply voltage to first bit line voltage setting circuit 320. First latch 330 is coupled to first charge/discharge circuit 310 and a first sense node SO to connect to the bit line. First latch 330 is configured to store the first bit line forcing information. First bit line voltage setting circuit 320 is coupled to first charge/discharge circuit 310 and second sense node SO2 to connect to the bit line. First bit line voltage setting circuit 320 is configured to apply the first bit line forcing voltage to second sense node SO2 based on the supply voltage according to the first bit line forcing information stored in first latch 330.

A supply voltage 340 is coupled to first charge/discharge circuit 310 and provides power to it. First latch 330 is configured to store data, which can be the data indicating a verification result after the programming and verification operation, or the data read out by a reading operation, etc. Here, as a verification result, the binary data “0” or “1” can be used to indicate whether the verification passed or not. First latch 330 in a first charge/discharge circuit 201 of an example of the present disclosure can be used to store the first bit line forcing information, which is used to indicate the verification result after a first sensing voltage verifying the memory cell.

In some examples, storing “0” in the first latch means the threshold voltage of the memory cell is higher than or equal to a first bit line sensing voltage, storing “1” in the first latch means the threshold voltage of the memory cell is lower than the first bit line sensing voltage. In some examples, storing “0” in the first latch means the threshold voltage of the memory cell is lower than the first bit line sensing voltage, storing "1" in the first latch means the threshold voltage of the memory cell is higher than or equal to the first bit line sensing voltage.

First bit line voltage setting circuit 320 described above can be an N-channel metal-oxide semiconductor (NMOS) or a P-channel metal-oxide semiconductor (PMOS), or a combination of multiple NMOS and/or multiple PMOS. The first bit line voltage setting circuit 320 can also be other components that can be used to embed or regulate the voltage, such as a Zener diode, transient voltage suppressor, varistor, etc.

First bit line voltage setting circuit 320 is able to embed the supply voltage at a suitable value based on the verification result stored in first latch 330, i.e., the stored first bit line forcing information configured to illustrate the verification result obtained by verifying the memory cell with the first bit line sensing voltage, then drive, for example, the first bit line forcing voltage to the bit line. The first bit line forcing voltage is lower than the supply voltage and higher than the grand voltage.

Applying the first bit line forcing voltage to the bit line based on the supply voltage, according to the verification result stored in the first latch, to narrow the distribution of the threshold voltages.

First charge/discharge circuit 310 includes a first charging switch, coupled to supply voltage 340 and first bit line voltage setting circuit 320, configured to drive supply voltage 340 to first bit line voltage setting circuit 320 according to a signal output by the first latch.

The first charging switch includes a control terminal, and the state (i.e., an "on" state or an "off" state) of the first charging switch is controlled by a signal input into the control terminal. The input signal is a signal sent by first latch 330. When the first charging switch turns on under the control of the signal sent by first latch 330, the supply voltage is applied to first bit line voltage setting circuit 320.

First latch 330 is configured to store the first bit line forcing information indicating the verification result obtained by verifying the memory cell by the first sensing voltage. That is, the first bit line forcing information can be used to control the state of first charging switch. When the first charging switch is on, the supply voltage is applied to first bit line voltage setting circuit 320. The first charging switch can drive the supply voltage to first bit line voltage setting circuit 320 during a pre-charge stage and a bit line setting stage.

Figure 4:
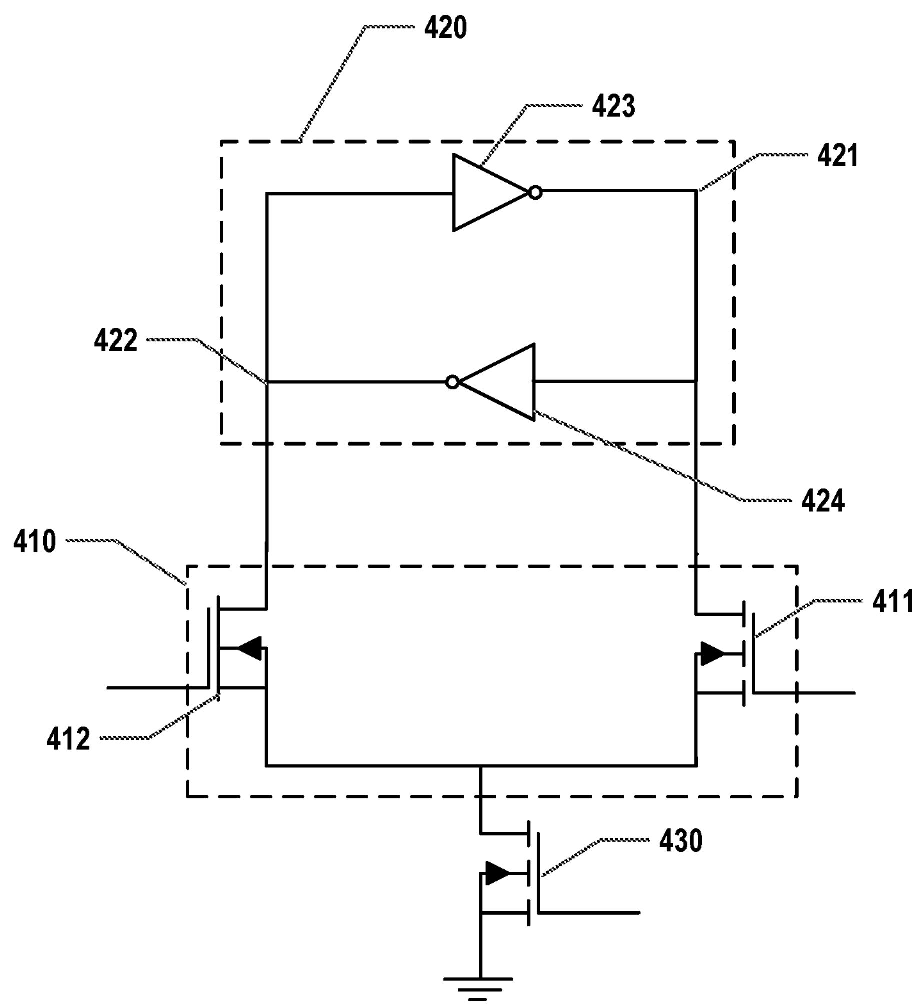
FIG. 4 illustrates a circuit diagram of an exemplary register of the page buffer, according to some aspects of the present disclosure.

Referring to FIG. 4, first latch 330 includes a first data latching circuit 420 configured to store verification information corresponding to a verified result, or to store the first bit line forcing information, and a first data setting circuit 410, coupled to first data latching circuit 420, configured to send the verification information to be stored or the first bit line forcing information to be stored to first data latching circuit 420.

First data latching circuit 420 includes an inverter 423 and an inverter 424 connected inversely, with the two inverter connection points being a first node 421 and a second node 422, respectively. First data setting circuit 410 includes an NMOS 412 and an NMOS 411, NMOS 412 is coupled to second node 422 of first data latching circuit 420 and NMOS 411 is coupled to first node 421 of first data latching circuit 420.

First latch 330 may also include a first sense switch 430, which can be an NMOS, a control terminal of the NMOS being coupled to the sense node SO, the NMOS conducting under a voltage of sense node SO and applying a ground voltage to first data setting circuit 410. First data setting circuit 410 selects the corresponding NMOS 412 and NMOS 411 for data setting based on the verification result after the first forced sensing voltage verification storage circuit.

First data setting circuit 410 transfers the ground voltage to first data latching circuit 420 in first node 421 or second node 422 based on the first bit line forcing information. In some examples, when the ground voltage is stored in first node 421, it can be used to indicate that data "0" is stored, and exemplarily, data "0" may indicate that the memory cell to be programmed for the corresponding bit line will not perform the first bit line forcing operation.

First node 421 can store the ground voltage by allowing the ground voltage to be transmitted through first sense switch 430 after first sense switch 430 is on. The first data latching circuit 420 includes an NMOS 412 and an NMOS 411 configured to apply the ground voltage transmitted by first sense switch 430 to second node 422 in response to a first data setting signal Sets. In addition, NMOS 411 is connected between first sense switch 430 and first node 421 and is configured to apply the ground voltage transmitted by first sense switch 430 to the first node 421 in response to a second data set signal Rsts.

A high voltage at first node 421 can be used to indicate that data "1" is stored, and data "1" can indicate that the memory cell to be programmed for the corresponding bit line will not perform the first bit line force operation. In some examples, a high voltage at second node 422 can be used to indicate that data "1" is stored, and the data "1" can indicate that the memory cell to be programmed for the corresponding bit line will not perform the first bit line forcing operation.

The second charge/discharge circuit includes a second charge/discharge circuit, a second latch, and a second bit line voltage setting circuit. The second latch, coupled to the bit line through a second charge/discharge circuit and a first sense node coupled to the page buffer, is configured to store the second bit line forcing information. The second charge/discharge circuit, coupled to the bit line through the page buffer and the first sense node coupled to a second bit line voltage setting circuit, is configured to drive a supply voltage to a second bit line voltage setting circuit. The second bit line voltage setting circuit, coupled to the bit line through the second charge/discharge circuit and the second sense node coupled to the page buffer, is configured to drive the second bit line forcing voltage to the second sense node by the supply voltage according to the second bit line forcing information stored in the second latch.

Distinguished from the first charge/discharge circuit, the second bit line voltage setting circuit of the second charge/discharge circuit can be coupled to the second charge/discharge circuit by the first sense node, whereas the first charge/discharge circuit can be directly coupled to the first charge/discharge circuit.

The second latch is configured to store data indicating the verification result after the programming and verifying operation, or data read out by the reading operation, etc. The second latch in the second charge/discharge circuit in the present disclosure can be used to store the second bit line forcing information indicating the verification result after verifying the memory cell by the second forced sensing voltage. The second bit line voltage setting circuit can be the same or different from the first bit line voltage setting circuit. The second bit line setting circuit can embed the supply voltage into a suitable value and drive it to the bit line.

The second charge/discharge circuit further includes a second charging switch, coupled to the supply voltage and the second bit line voltage setting circuit, configured to drive the supply voltage to the second bit line voltage setting circuit according to aa signal output by the second latch, a control terminal of the second charging switch is coupled to the second latch. The components used in the second charging switch can be the same or different from the first charging switch. The second charging switch is controlled by a signal output from a second latch, which may be used to store a second bit line forcing information indicating the verification result after verifying the memory cell with the second forced sensing voltage. That is, the second charging switch can be controlled by the second bit line forcing information. When the second charging switch is on, the supply voltage is provided to the second bit line voltage setting circuit.

The second latch includes a second data latching circuit configured to store verification information corresponding to a verified result, or to store the second bit line forcing information, and a second data setting circuit, coupled to the second data latching circuit, configured to send the verification information to be stored or the second bit line forcing information to be stored to the second data latching circuit. The component of the second latch can be the same or different from the first latch. The second latch further includes a second sensing switch. In some examples, the first sensing switch and the second sensing switch can be the same component, i.e., the first sensing switch is the second sensing switch. In some examples, the first sensing switch and the second sensing switch are the same components independent of each other. In some examples, the first sensing switch and the second sensing switch are different, e.g., NMOS for the first sensing switch and PMOS for the second sensing switch.

The first charge/discharge circuit is further configured to store verification information and drive the programming bit line voltage to the bit line when the verification information allows programming. The page buffer includes a dynamic latch, coupled to a first sense node of the page buffer, configured to store the first bit line forcing information, and send the first bit line forcing information to the first charge/discharge circuit after the programming bit line voltage is driven to the bit line by the first charge/discharge circuit.

The first charge/discharge circuit is also configured to store programming verification information configured to distinguish whether a memory cell is being prohibited or allowed from programming. When the programming verification information indicates that the memory cell allows programming, the first charge/discharge circuit will pre-charge the bit line-to the programming bit line voltage (e.g., Vss).

Verification results are obtained after a verification voltage (e.g., first sensing voltage, second sensing voltage, and verification voltage) is used to verify the memory cell. For example, one verification result can be obtained after using one verification voltage for verification, two verification results can be obtained after using two verification voltages for verification, and N verification results can be obtained after using N verification voltages for verification. Each validation result corresponding to a specific validation voltage can be represented by binary data “0” or “1”. Some or all of the verification results are stored in the dynamic latch.

In this present example, the verification result obtained by verifying the memory cell with the first sensing voltage, i.e., the first bit line forcing information, can be first stored in the dynamic latch. The verification information is stored in the first charge/discharge circuit stores. When the verification information indicates that the memory cell allows programming, the first charge/discharge circuit can use the verification information to pre-charge the bit line to the programming bit line voltage (e.g., Vss). The first bit line forcing information stored in the dynamic latch is passed to the first charge/discharge circuit after the pre-charging process is completed. The first charge/discharge circuit then determines which type of voltage will be supplied to the bit line based on the first bit line forcing information.

The dynamic latch includes a third data latching circuit configured to store the first bit line forcing information, and a third data setting circuit, coupled to the third data latching circuit, configured to send the first bit line forcing information to the third data latching circuit. The component of the dynamic latch can be the same or different from the second latch or the first latch.

Distinguished from the first latch and the second latch, the dynamic latch is not part of the charge/discharge circuits. The dynamic latch is only used to temporarily store the verification results obtained by verifying the memory cell with the first sensing voltage. The first charge/discharge circuit is configured to provide the supply voltage to the bit line to prohibit the memory cell from programming where the verification information prohibits programming.

When the verification result (i.e., verification information) indicates that the threshold voltage of the memory cell to be programmed reaches the target threshold voltage, it is temporarily not necessary to continue programming the memory cell any further, so the memory cell is to be disabled from programming by pre-charging the bit line to the programming-inhabit bit line voltage. The programming-inhabit bit line voltage can be derived from the supply voltage, i.e., the supply voltage is connected directly to the bit line. Exemplarily, the first bit line voltage setting circuit can then be controlled not to embed or divide the supply voltage, i.e., the first bit line voltage setting circuit is set to a fully on state. Of course, it is also possible to apply the supply voltage to the bit line as a programming-inhabit bit line voltage through other paths coupled to the supply voltage. When the first bit line voltage setting circuit is an NMOS, the first bit line voltage setting circuit can be fully conductive by applying a larger voltage to the control terminal of the NMOS to prevent the supply voltage from being embedded or divided. Therefore, the bit line can be provided with the supply voltage for prohibiting programming.

Figure 5:
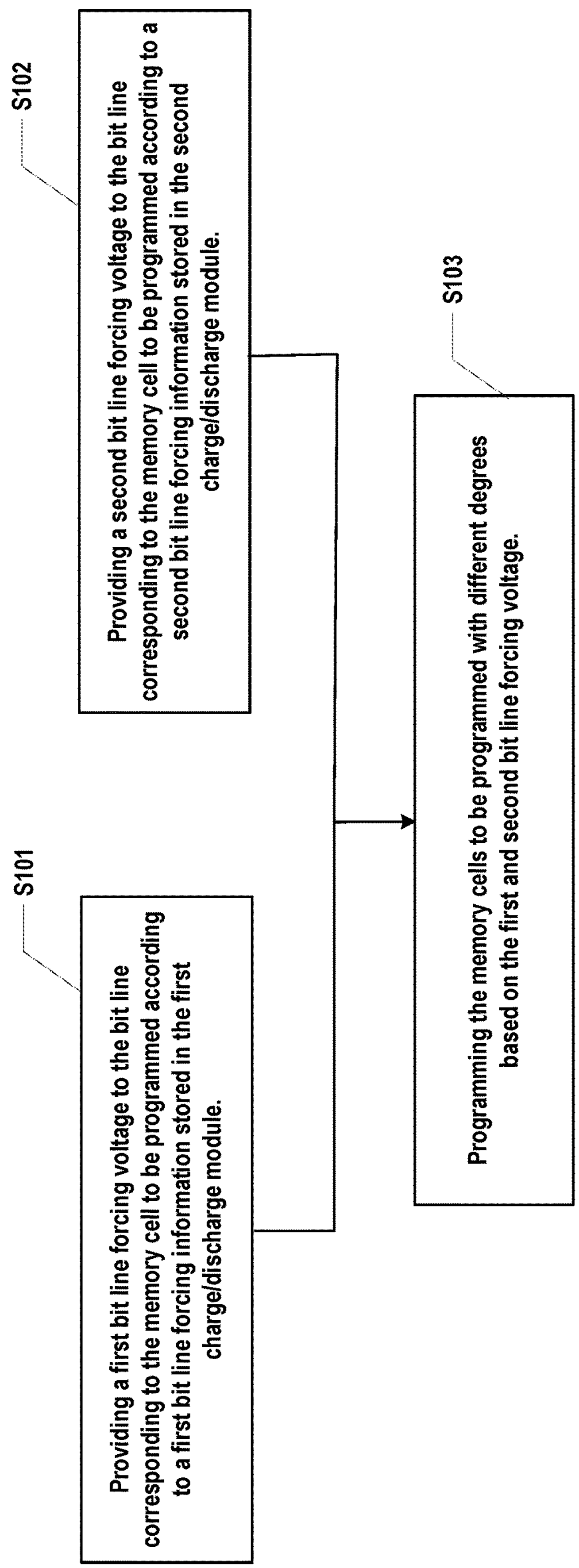
FIG. 5 illustrates a flowchart of an exemplary method for operating a memory device including a page buffer, according to some aspects of the present disclosure.

FIG. 5 illustrates a flowchart of a method for operating a memory device, according to some aspects of the present disclosure. The memory device may be any suitable memory device disclosed herein, such as page buffers in page buffer bank 90. The page buffers are set corresponding to the bit lines of the memory cell array of the memory device. It is understood that the operations shown in the method may not be exhaustive and that other operations can be performed as well before, after, or between any of the illustrated operations. Further, some of the operations may be performed simultaneously, or in a different order than shown in FIG. 5.

Referring to FIG. 5, the method starts at operations 101 and 102. In operation 101, the first bit line forcing voltage is driven to a bit line corresponding to a memory cell to be programmed according to a first bit line forcing information stored in the first charge/discharge circuit. In operation 102, the second bit line forcing voltage is driven to the bit line according to a second bit line forcing information stored in a second charge/discharge circuit. The first bit line forcing voltage and the second bit line forcing voltage are both higher than a programming bit line voltage and lower than a programming-inhabit bit line voltage.

Then the method proceeds to operation 103, in which the memory cell is programmed by the first bit line forcing voltage and second bit line forcing voltage respectively.

In implementations of the present disclosure, additional first bit line forcing voltage and second bit line forcing voltage are applied to the memory cell to be programmed, the first bit line forcing voltage is provided by a first charge/discharge circuit of the page buffer, the second bit line forcing voltage is provided by a second charge/discharge circuit of the page buffer. Different charge/discharge circuits can provide different bit line forcing voltages. A suitable voltage among the voltages including the first and second bit line forcing voltages can be selected and applied to the bit lines based on the first bit line forcing information in the first charge/discharge circuit and the second bit line forcing information in the second charge/discharge circuit for programming the memory cell at different speeds. The larger the bit line forcing voltage is, the more difficult it is to charge the memory cell during programming. The verification result (i.e., the first bit line forcing information and the second bit line forcing information) can be used to indicate the gap between the current threshold voltage of the memory cell and the target threshold voltage during programming. Fine programming can be achieved by selecting different bit line forcing voltages to be applied to the bit lines according to the gap.

In operation 101, applying a first bit line forcing voltage to a bit line corresponding to a memory cell to be programmed according to a first bit line forcing information stored in a first charge/discharge circuit includes: storing the first bit line forcing information in a first latch of the first charge/discharge circuit after performing a first bit line sensing voltage verification on the memory cell to be programmed; applying a supply voltage to a first bit line voltage setting circuit of the first charge/discharge circuit through a first charge/discharge circuit of the first charge/discharge circuit; and applying the first bit line forcing voltage to a second sense node coupled to the bit line based on the supply voltage, according to the first bit line forcing voltage, by the first bit line voltage setting circuit.

The first bit line sensing voltage is configured to verify the memory cell to be programmed, and the verification result is recorded by the first bit line forcing information. When the first bit line forcing information indicates that the threshold voltage of the memory cell is higher than or equal to the first bit line sensing voltage, the first bit line forcing voltage is applied to the second sense node of the bit line corresponding to the memory cell to be programmed based on the supply voltage by the first bit line voltage setting circuit. When the first bit line forcing information indicates that the threshold voltage of the memory cell is lower than the first bit line sensing voltage, the first bit line forcing voltage will not be applied to the second sense node.

In some implementations, applying a supply voltage to a first bit line voltage setting circuit of the first charge/discharge circuit through a first charge/discharge circuit of the first charge/discharge circuit includes: applying the supply voltage to the first bit line voltage setting circuit by a first charging switch of the first charge/discharge circuit according to a signal sent by the first latch.

The signal output by the first latch can control the conduction of the first charging switch, which can provide a supply voltage to the first bit line voltage setting circuit during the pre-charge phase and the bit line voltage setting phase when the first charging switch is on. During the pre-charging phase, the first latch provides a supply voltage to the first bit line voltage setting circuit in a state where its stored programming verification information for prohibiting programming. In the bit line voltage setting phase, the first latch applies the supply voltage to the first bit line voltage setting circuit when the first bit line forcing information indicates the threshold voltage of the memory cell to be programmed is higher than or equal to the first bit line sense voltage.

In operation 102, applying a second bit line forcing voltage to a bit line corresponding to a memory cell to be programmed according to a second bit line forcing information stored in a second charge/discharge circuit includes: storing the second bit line forcing information in a second latch of the second charge/discharge circuit after performing a second bit line sensing voltage verification on the memory cell to be programmed; applying a supply voltage to a second bit line voltage setting circuit of the second charge/discharge circuit through a second charge/discharge circuit of the second charge/discharge circuit; and applying the second bit line forcing voltage to a second sense node coupled to the bit line based on the supply voltage, according to the second bit line forcing voltage, by the second bit line voltage setting circuit.

The second bit line sensing voltage is configured to verify the memory cell to be programmed, and the verification result is recorded by the second bit line forcing information. When the second bit line forcing information indicates that the threshold voltage of the memory cell is higher than or equal to the second bit line sensing voltage, the second bit line forcing voltage is applied to the second sense node of the bit line corresponding to the memory cell to be programmed based on the supply voltage by the second bit line voltage setting circuit. When the second bit line forcing information indicates that the threshold voltage of the memory cell is lower than the second bit line sensing voltage, the second bit line forcing voltage will not be applied to the second sense node.

In some implementations, applying a supply voltage to a second bit line voltage setting circuit of the second charge/discharge circuit through a second charge/discharge circuit of the second charge/discharge circuit includes: applying the supply voltage to the second bit line voltage setting circuit by a second charging switch of the second charge/discharge circuit according to a signal sent by the second latch.

The signal output by the second latch can control the conduction of the second charging switch, which can provide a supply voltage to the second bit line voltage setting circuit during the pre-charge phase and the bit line voltage setting phase when the second charging switch is on. During the pre-charging phase, the second latch provides a supply voltage to the second bit line voltage setting circuit in a state where its stored programming verification information prohibits programming. In the bit line voltage setting phase, the second latch applies the supply voltage to the second bit line voltage setting circuit when the second bit line forcing information indicates the threshold voltage of the memory cell to be programmed is higher than or equal to the second bit line sense voltage.

In some implementations, the method further includes: storing verification information into the first charge/discharge circuit; applying the programming bit line voltage to the bit line when the verification information allows programming; and sending the first bit line forcing information to the first charge/discharge circuit by a dynamic latch of the page buffer after providing the programming bit line voltage to the bit by the first charge/discharge circuit.

After the programming bit line voltage is applied to the bit line by the first charge/discharge circuit, the first bit line forcing information is sent to the first charge/discharge circuit by the dynamic latch of the page buffer. The first latch is configured to store verification information. During the pre-charge phase, the first latch provides the programming bit line voltage to the bit line when the verification information allows programming. After the programming bit line voltage is applied to the bit line by the first charge/discharge circuit, the first bit line forcing information is sent to the first charge/discharge circuit for setting the bit line voltage during the bit line voltage setting phase by the dynamic latch of the page buffer.

In some implementations, the method further includes providing the programming-inhabit bit line voltage to the bit line when the verification information prohibits programming.

Figure 6:
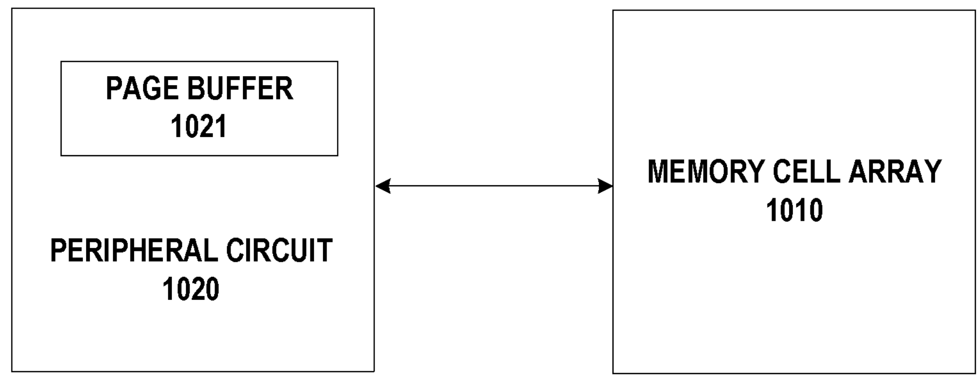
FIG. 6 illustrates a block diagram of an exemplary memory device, according to some aspects of the present disclosure.

Referring to FIG. 6, some implementations of the present disclosure provide a memory device 1000 including a memory cell array 1010 and a peripheral circuit 1020. Memory cell array 1010 includes a plurality of memory cells and a plurality of bit lines coupled to the plurality of memory cells. Peripheral circuit 1020 is coupled to memory cell array 1010, and is configured to control memory cell array 1010.

Peripheral circuit 1020 includes a page buffer corresponding to the bit lines of memory cell array 1010. The page buffer includes the first charge/discharge circuit and the second charge/discharge circuit illustrated above. The first charge/discharge circuit coupled to the bit line and configured to store first bit line forcing information and apply a first bit line forcing voltage to the bit line based on the first bit line forcing information to the bit line. The second charge/discharge circuit coupled to the bit line and configured to store a second bit line forcing information and apply a second bit line forcing voltage, different from the first bit line forcing voltage, to the bit line based on the second bit line forcing information. The first bit line forcing voltage and the second bit line forcing voltage are both higher than a programming bit line voltage and lower than a programming-inhabit bit line voltage. The details of the page buffer have been described above and will not be repeated herein.

Memory device 1000 can be a non-volatile memory product such as a NAND flash. Memory cell array 1010 can be any suitable memory cell array 1010. For example, memory cell array 1010 may include a plurality of memory cells arranged in a memory block. Each of the memory blocks includes a plurality of memory strings coupled between a bit line and a common source line. That is, the memory strings are coupled to the corresponding bit lines separately. The memory strings are also coupled to the common source line. Each memory string includes a source select transistor coupled in series with each other, a plurality of memory cells, and a drain select transistor. Peripheral circuit 1020 is coupled to memory cell array 1010 via one or more bit lines, and peripheral circuit 1020 includes a page buffer bank, and the page buffer bank includes one or more page buffers 1021 as described in the above-described embodiments. Page buffers 1021 include sense nodes SO for determining the state of the memory cells therein (e.g., the data stored in the memory cells), each of page buffer 1021 is coupled to the bit line via the sense node SO. The state of the storage circuit may be determined by detecting the current flowing through the sense node SO.

Figure 7:
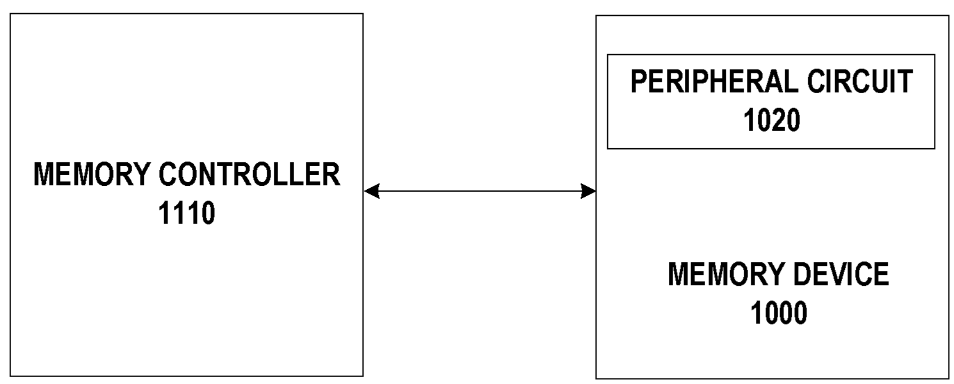
FIG. 7 illustrates a block diagram of an exemplary memory system, according to some aspects of the present disclosure.

Referring to FIG. 7, some implementations of the present disclosure provide a memory system 1100 including memory device 1000 as described above, and a memory controller 1110 coupled to memory device 1000 and configured to control memory device 1000. Memory device 1000 includes peripheral circuitry 1020. In some implementations, memory system 1100 can be any memory system such as an SSD, or an electronic device containing the memory device 1000, such as a computer and the like.

Figure 8:
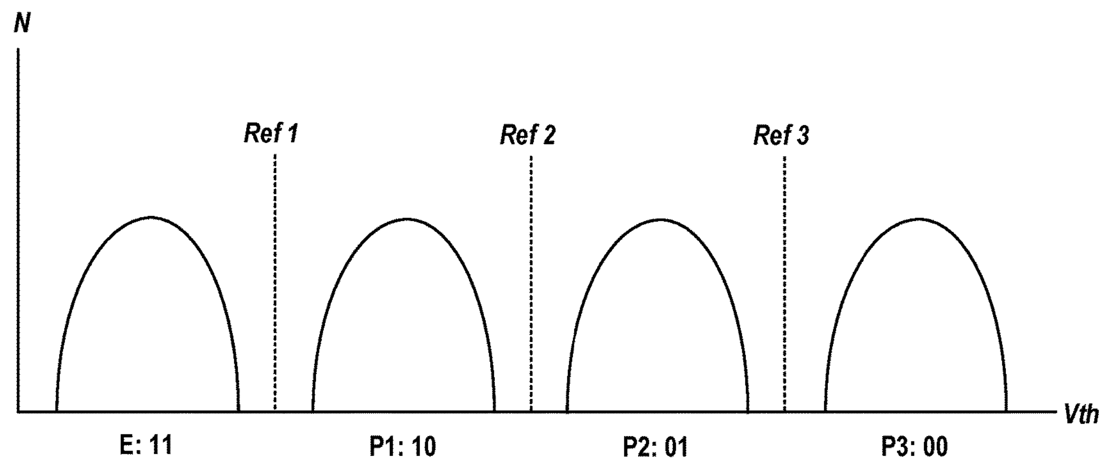
FIG. 8 illustrates a distribution diagram of threshold voltages of an exemplary memory device including a plurality of multi-level memory cells (MLC), according to some aspects of the present disclosure.

The memory cell employed in the memory device can be a multiple level cell (MLC), trip-level cell (TLC), or quad-level cell (QLC) blocks. MLC is taken as an example in the present implementations, which is similar to TLC and QLC. FIG. 8 shows the threshold voltage distribution of MLC memory at different threshold states. MLC memory has four states, including an erase state E having the lowest threshold voltage (corresponding to a logic value of 11), and three programming states P1, P2 and P3 ranged by threshold voltages from low to high, corresponding to logic values of 10, 01 and 00. For different models and manufacturers of memory, there are other correspondences between threshold states and logic values. Referring to FIG. 8, each threshold state corresponds to a threshold voltage distribution that is normally distributed and ideally does not overlap with each other. The non-overlapping parts between the threshold voltage distributions are called Distribution margins. When a memory cell is read, read reference voltages (Ref1, Ref2, Ref3) are positioned within the distribution margins. Therefore, for an MLC memory, the narrower the threshold voltage distribution, the larger the corresponding distribution margin and the reading window between different threshold states. A narrow distribution margin will lead to a narrow window for read operations and make it easy to cause read errors.

Figure 9:
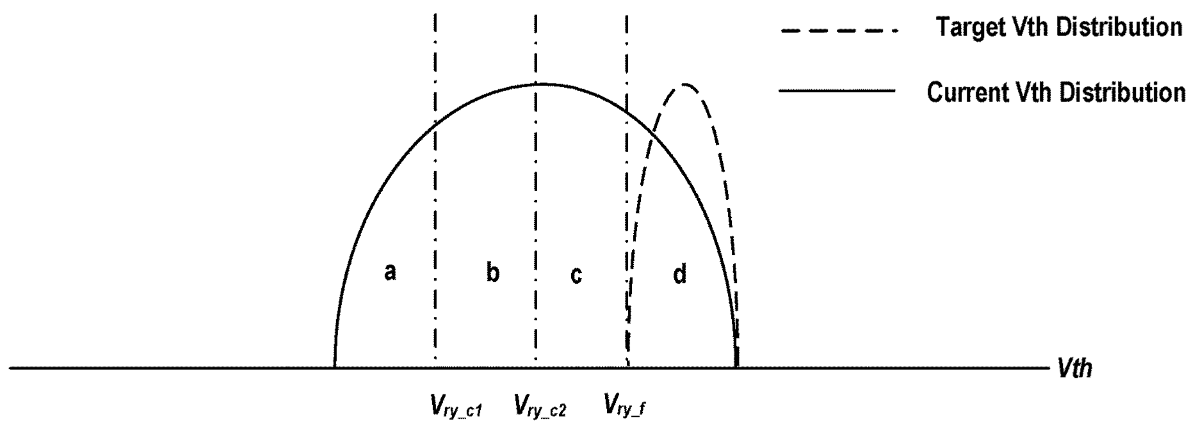
FIG. 9 illustrates a distribution diagram of threshold voltages of an exemplary memory device, according to some aspects of the present disclosure.

In some implementations, referring to FIG. 9, for a certain threshold voltage distribution, three verification voltages are used to verify whether the memory cell reaches the target threshold voltage distribution or not. The three verification voltages are, from largest to smallest, the verification voltage $V_{ry\_f}$, the second forced sense voltage $V_{ry\_c2}$, and the first forced sense voltage $V_{ry\_c1}$. All three verification voltages are within the current threshold voltage distribution. The current threshold voltage range is divided into four regions: a, b, c, and d.

When the threshold voltage of a memory cell is verified to be higher than or equal to the programmed verification voltage $V_{ry\_f}$, it means that the current threshold voltage of this memory cell has been programmed to be within region d of the target threshold voltage distribution. At this point, further programming of that memory cell is prohibited, i.e., a programming-inhabit bit line voltage (e.g., $V_{dd}$ voltage) is applied to the bit line coupled to that memory cell.

When the threshold voltage of a memory cell is verified to be higher than or equal to the second forced sensing voltage $V_{ry\_c2}$ and is lower than the verification voltage $V_{ry\_f}$, it means that the threshold voltage of the memory cell has been programmed to be within region c of the target threshold voltage distribution. Considering that the threshold voltage distribution for the memory cell is aimed to converge into the target threshold voltage distribution, the memory cell with a threshold voltage within the region c needs to be programmed continuously, while the degree of this programming needs to be controlled to prevent over programming. A second bit line forcing voltage $V_{mid2}$ is applied to the bit line to control the programming degree. $V_{mid2}$ is lower than the $V_{dd}$ and higher than the ground voltage.

When the threshold voltage of a memory cell is verified to be higher than or equal to the first forced sensing voltage $V_{ry\_c1}$ and is lower than the first forced sensing voltage $V_{ry\_c2}$, it means that the threshold voltage of the memory cell has been programmed to be within region b of the target threshold voltage distribution. Considering that the threshold voltage distribution for the memory cell is aimed to converge into the target threshold voltage distribution, the memory cell with a threshold voltage within the region c needs to be programmed continuously, while the degree of this programming needs to be controlled to prevent over programming. It should be understood that the degree of the current program is higher than the degree of a memory cell with a threshold voltage in region b. A first bit line forcing voltage $V_{mid1}$ is applied to the bit line to control the programming degree. $V_{mid1}$ is lower than the $V_{mid2}$ and higher than the ground voltage.

When the threshold voltage of a memory cell is verified to be lower than the first forced sensing voltage $V_{ry\_c1}$, it means that the threshold voltage of the memory cell has been programmed to be within region a of the target threshold voltage distribution, which is far from the target threshold voltage distribution. Using $V_{mid1}$ or $V_{mid2}$ to program the memory cell will consume a long time, although the program degree can be controlled. Therefore, the programming bit line voltage, i.e., the ground voltage, should be applied to the bit line when the threshold voltage of the memory cell has been programmed to be within region a.

In conclusion, at least four different bit line voltages can be used to prohibit programming and programming in three different degrees based on the verification results and obtain a narrow threshold voltage distribution to facilitate reading operations.

Figure 10:
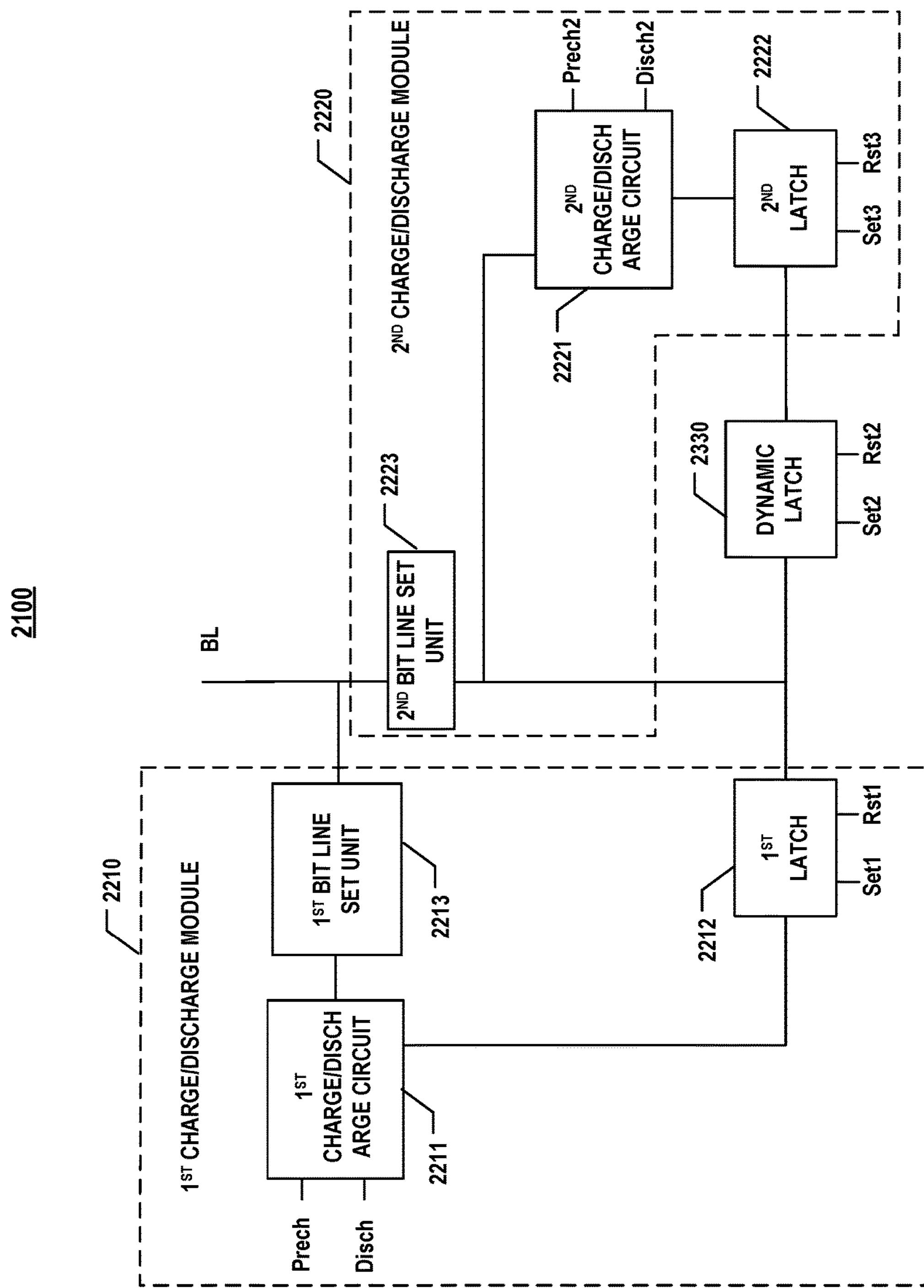
FIG. 10 illustrates a block diagram of an exemplary memory device including a page buffer, according to some aspects of the present disclosure.

In some implementations, referring to FIG. 10, a pager buffer 2100 is provided with a first charge/discharge circuit 2210 and a second charge/discharge circuit 2220, first charge/discharge circuit 2210 includes a first charge/discharge circuit 2211, a first latch 2212, and a first bit line voltage setting circuit 2213. First bit line voltage setting circuit 2213 can be a NMOS controlled by $V_{blbias}$ to embed the supply voltage. The output information of first latch 2212 can control first charge/discharge circuit 2211 to provide the supply voltage $V_{dd}$ to the first bit line voltage setting circuit 2213. Second charge/discharge circuit 2220 includes a second charge/discharge circuit 2221, a second latch 2222, and a second bit line voltage setting circuit 2223. Second bit line voltage setting circuit 2223 can be an NMOS to embed the supply voltage. Second latch 2222 controls second charge/discharge circuit 2221 to provide supply voltage $V_{dd}$ to second bit line voltage setting circuit 2223. Page buffer 2100 has a dynamic latch 2330 for recording at least one verification result (e.g., verification information and/or first bit line forcing information and/or second bit line forcing information).

First charge/discharge circuit 2210 is able to drive the first bit line forcing voltage $V_{mid1}$ or a programming-inhabit bit line voltage (e.g., $V_{dd}$) to the bit line, and second charge/discharge circuit 2220 is able to drive a second bit line forcing voltage $V_{mid2}$ to the bit line. The supply voltage provided by first charge/discharge circuit 2211 can be embedded to $V_{mid1}$ by first bit line voltage setting circuit 2213. The supply voltage provided by second charge/discharge circuit 2221 can be embedded to $V_{mid2}$ by second bit line voltage setting circuit 2223.

Figure 11:
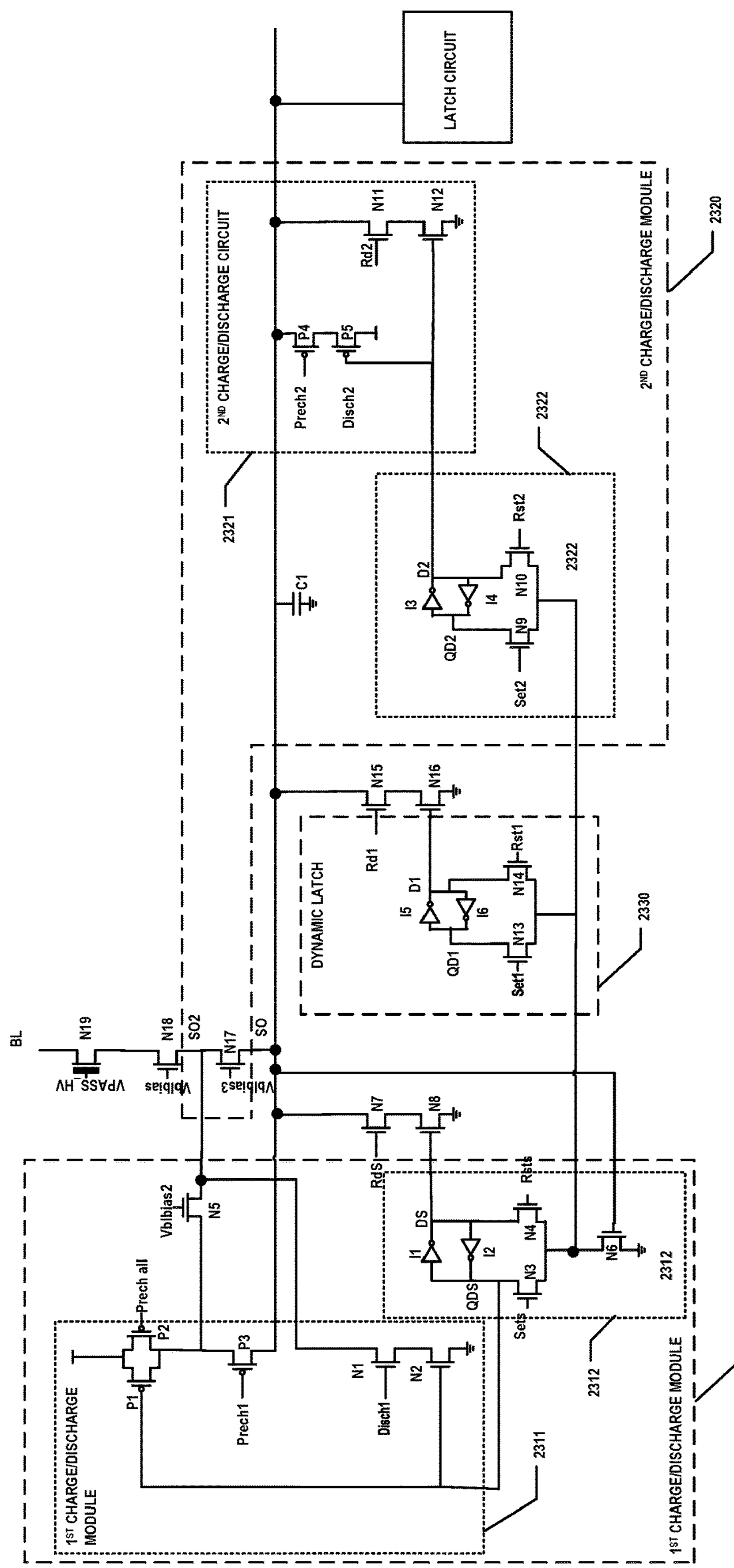
FIG. 11 illustrates a circuit diagram of an exemplary memory device including a page buffer, according to some aspects of the present disclosure.

In some implementations, referring to FIG. 11, first charge/discharge circuit 2310 includes a first charge/discharge circuit 2311, a first latch 2312, and a first bit line voltage setting circuit (i.e., NMOS N5). Two ends of the first charge/discharge circuit 2311 are coupled to a supply voltage and a ground to provide the supply voltage or the ground voltage to first bit line voltage setting circuit N5. First latch 2312 is coupled to first charge/discharge circuit 2311 and the bit line BL. First latch 2312 can store the verification results after verifying the memory cell with the first sensing voltage and the verification voltage. The source and drain of first bit line voltage setting circuit N5 are coupled to first charge/discharge circuit 2311 and bit line BL respectively, and the gate of N5 is controlled by $V_{blsias2}$. First bit line voltage setting circuit N5 can be configured to apply a corresponding first bit line forcing voltage or a programming-inhabit bit line voltage (e.g., $V_{dd}$) to the bit line BL based on the supply voltage sent from first charge/discharge circuit 23121 according to the verification result stored in first latch 2312.

Second charge/discharge circuit 2320 includes a second charge/discharge circuit 2321, a second latch 2322, and a second bit line voltage setting circuit (i.e., NMOS N17), two ends of second charge/discharge circuit 2321 are coupled to supply voltage and ground to provide the supply voltage or the ground voltage to second bit line voltage setting circuit N17. Second latch 2322 is coupled to second charge/discharge circuit 2321 and bit line BL, and second latch 2322 is configured to store the verification result after verifying the memory cell with the second forced sensing voltage. The source and drain of the second bit line voltage setting circuit N17 are coupled to second charge/discharge circuit 2321 and to bit line BL respectively, and the gate of N17 is controlled by the signal $V_{blsias3}$. Second bit line voltage setting circuit N17 is configured to apply the second bit line voltage to bit line BL based on supply voltage transmitted from second charge/discharge circuit 2321 based on the verification results stored in second latch 2322.

NMOS N18 and NMOS N19 are provided in series on bit line BL, and the bit line forcing voltage transmitted from first bit line voltage setting circuit N5 or second bit line voltage setting circuit N17 can be applied to bit line BL via NMOS N18 and NMOS N19 (in the case of NMOS N18 and NMOS N19 conduction) in sequence. NMOS N18 is controlled by the gate control signal $V_{blsias}$ and NMOS N19 is controlled by the gate control signal $V_{pass\_HV}$.

First latch 2312 is provided with a first data latching circuit, which is mainly formed by two inverters I1 and I2 connected in parallel reversely and can store the verification results derived from a certain post-programming verification operation (e.g., verification operation using the first sensing voltage and/or verification operation using the programmed voltage). First latch 2312 is also provided with a first data setting circuit coupled to the first data latching circuit, which includes NMOS N3 and NMOS N4. The first data setting circuit can output the verification results to be stored (e.g., first bit line forcing information and/or verification information) to the first data latching circuit during the verification after a certain programming. First latch 2312 is also provided with a first sensing switch including NMOS N6 coupled to the ground and first data setting circuit, the gate of first sensing switch N6 is coupled to the sense node SO. N6 can be conducted under the control of the voltage of the sense node SO and drive the ground voltage to the first node or the second node of the first data latching circuit if either of the first data setting circuit NMOS N3 or NMOS N4 is on.

Second latch 2322 is provided with a second data latching circuit mainly formed by two inverters I3 and I4 connected in parallel reversely and can store the verification result from a certain post-programming verification operation (e.g., a verification operation using a second sensing voltage). Second latch 2322 is also provided with a second data setting circuit coupled to the second data latching circuit, including NMOS N9 and NMOS N10, and the second data setting circuit can output the verification result to be stored (e.g., second bit line forcing information) to the second data latching circuit during the verification operation after certain programming. The second latch can also be provided with a second sensing switch. In this implementation, second latch 2322 shares the first sensing switch N6 with first latch 2312.

The first data latching circuit of first latch 2312 temporarily stores the data to be programmed into a particular cell or temporarily stores the data read from a particular cell. For this purpose, an output of inverter I1 is coupled to an input of inverter I2 and an output of inverter I2 is coupled to an input of inverter I1. Here, the node where the output of the inverter I1 coupled to the input of the inverter I2 is referred to as a first node DS. The node where the output of the inverter I2 is coupled to the input of the inverter I1 is referred to as the second node QDS.

The second data latching circuit of second latch 2322 temporarily stores the data to be programmed into a particular cell or temporarily stores the data read from a particular cell. For this purpose, an output of inverter I3 is coupled to an input of inverter I4, and an output of inverter I4 is coupled to an input of inverter I3. Here, the node where the output of the inverter I3 is coupled to the input of the inverter I4 is referred to as a third node DS. The node where the output of the inverter I4 is coupled to the input of the inverter I3 is referred to as the fourth node QDS.

First data setting circuit of first latch 2312 includes NMOS N3 as a first data setting circuit and NMOS N4 as a second data setting circuit, with NMOS N3 configured to apply ground voltage to second node QDS of the first data latch circuit and NMOS N4 configured to apply a ground voltage to first node DS. NMOS N3 is connected between first sensing switch N6 and second node QDS and is configured to apply ground voltage relayed by the first sensing switch N6 to second node QDS in response to the first data setting signal Sets. NMOS N4 is connected between the first sensing switch N6 and the first node DS and is configured to apply ground voltage relayed by the first sensing switch N6 to first node DS in response to the second data setting signal Rsts.

Second data setting circuit of the second latch 2322 includes NMOS N9 as a third data setting circuit and NMOS N10 as a fourth data setting circuit, NMOS N9 is configured to apply ground voltage to fourth node QD2 of the second data latch circuit, and NMOS N10 is configured to apply ground voltage to third node D2 of the second data latch circuit. NMOS N9 is connected between the first sensing switch N6 and the second node QD2 and is configured to apply the ground voltage relayed by the first sensing switch N6 to fourth node QD2 of the second data latching circuit in response to third data setting signal Set2. In addition, NMOS N10 is connected between the first sense switch N6 and the first node D2 of the second data latching component and is configured to apply the ground voltage relayed by the first sensing switch N6 to the first node DS2 of the second data latching component in response to the fourth data setting signal Rst2.

First sensing switch N6 applies ground voltage to each data setting circuit based on the voltage of sense node SO. In some implementations, the first sensing switch N6 is an NMOS, and when the voltage of sense node SO is high, the first sensing switch conducts and applies ground voltage to each data setting circuit. When the first data setting signal Sets is applied with a high voltage, the ground voltage is applied to second node QDS. In this case, it is determined that a high-level voltage has been applied to first node DS. When the second data setting signal Rsts is applied with a high voltage, the ground voltage is applied to the first node DS. In this case, it is determined that a low-level voltage has been applied to first node DS.

The page buffer further includes a dynamic latch 2330, coupled to a first sense node of the page buffer, configured to store the first bit line forcing information, and send the first bit line forcing information to the first charge/discharge circuit 2310 after the programming bit line voltage is driven to the bit line by the first charge/discharge circuit 2310. The components of the dynamic latch 2330 and the first latch 2312 or the second latch 2322 can be the same. The dynamic latch 2330 can share a first sensing switch N6 with first latch 2312 and/or the second latch 2322.

The first charge/discharge circuit 2310 further includes a first discharge circuit including a discharge switch NMOS N7 and NMOS N8 connected in series between the ground and the sense node SO of bit line. A gate of NMOS N7 is used to receive the discharge indication signal RDS, and a gate of NMOS N8 is controlled by information stored in first node DS of the first data latching circuit. The first discharge circuit of the first charge/discharge circuit 2310 is configured to selectively connect sense node SO with the ground according to the data stored in first node DS of the first data latching circuit and in response to the discharge indication signal RDS.

The second charge/discharge circuit 2320 further includes a second discharge circuit including a discharge switch NMOS N11 and NMOS N12 connected in series between the ground and the sense node SO of the bit line. A gate of NMOS N11 is used to receive the discharge indication signal RD2, and a gate of NMOS N12 is controlled by information stored in second node QD2 of the second data latching circuit. The second discharge circuit of the second charge/discharge circuit 2320 is configured to selectively connect sense node SO to ground according to the data stored in the second node D2 of the second data latching circuit and in response to the discharge indication signal RD2.

Page buffer 2300 may also include other charge/discharge circuits for setting additional bit line forcing voltages.

Four verification results can be obtained by verifying the memory cell with the first sensing voltage, the second sensing voltage, and the verification voltage, as shown in TABLE 1 below.

TABLE 1

| Node DS | Node D1 | Node D2 | Verification Result |
|---|---|---|---|
| 1 | 1 | 0 | Vth is higher than or equal to the verification voltage |
| 0 | 1 | 0 | Vth is higher than or equal to the second sensing voltage and lower than the verification voltage |
| 0 | 1 | 1 | Vth is higher than or equal to the first sensing voltage and lower than the second sensing voltage |
| 0 | 0 | 1 | Vth is lower than the verification voltage |

Figure 12:
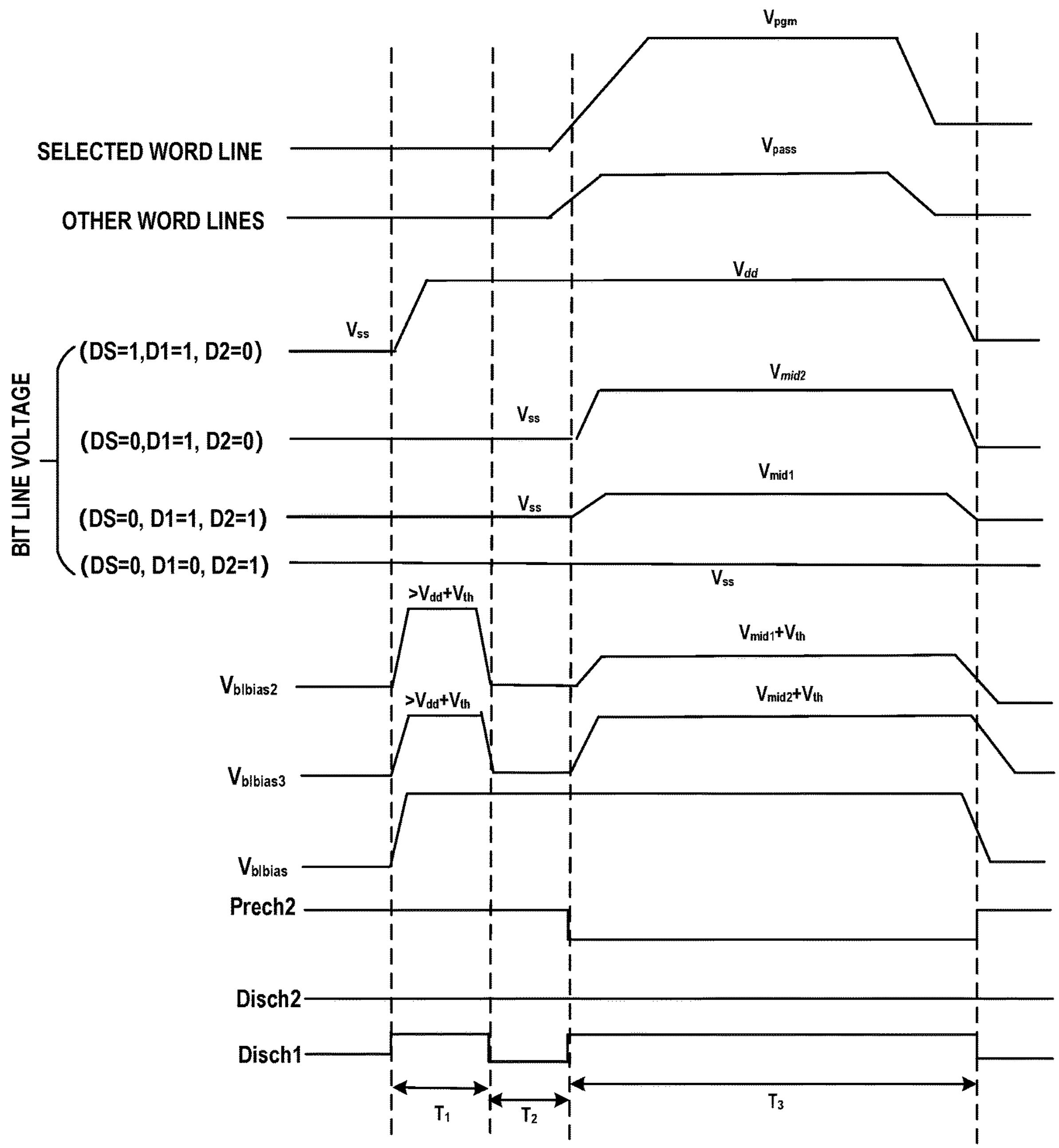
FIG. 12 illustrates a voltage chart of voltages applied to an exemplary memory device to set a voltage of a bit line, according to some aspects of the present disclosure.

Referring to FIG. 12, a waveform diagram of control signals applied to the various components in the page buffer and the word lines where the memory cell is located when a bit line forcing voltage is applied to the bit line is illustrated, which reflects the programming process of the memory device.

Pre-charge phase $T_1$: set an initial bit line voltage according to the value of the node DS of first charge/discharge circuit in the first based on the verification results shown in Table 1

As shown in FIG. 12, in pre-charge phase $T_1$, the signal Prech2 is in a high level, so the second charge/discharge circuit is disconnected from the bit line, i.e., the bit line can be pre-charged without using the second charge/discharge circuit.

When DS=1 and QDS=0, QDS can control the first charging switch PMOSP1 of the first charge/discharge circuit to be conducted. At the same time, a high-level voltage higher than $V_{dd}+V_{th}$ is applied to the first bit line voltage setting circuit N5 and turned on N5 to conduct so that the supply voltage is pre-charged to the bit line. When DS=0 and QDS=1, QDS can control NMOS N2 to be conducted. N2 is coupled to the ground voltage and directly coupled to the bit line, so that the ground voltage can pre-charged the bit line directly.

In Pre-charge phase $T_1$, the ground voltage is applied to the selected word lines and the unselected word lines at the same time. In this way, bit lines coupled to memory cells with a threshold voltage higher than or equal to the verification voltage are pre-charged to the supply voltage $V_{dd}$ to prohibit programming, and bit lines coupled to memory cells with a threshold voltage lower than the verification voltage are pre-charged to the ground voltage.

Data transfer phase $T_2$: the voltage of signal Disch1 is changed from high-level to low-level to stop pre-charging the bit line. Currently, the bit line voltage is in a floating state. At the same time, the first bit line forcing information stored in dynamic latch 2331 is transferred to first latch 2312, i.e., the first bit line forcing information in the dynamic latch is used to replace the verification information in the first latch. The data in dynamic latch 2331 and second latch 2322 are stored unchanged.

The verification results and targeted bit line voltages are changed and shown in TABLE 2 below.

TABLE 2

| Node DS | Node D1 | Node D2 | Targeted Bit Line Voltage |
|---|---|---|---|
| 1 | 1 | 0 | Apply the programming-inhabit bit line voltage to the bit line |
| 1 | 1 | 0 | Apply the second bit line forcing voltage to the bit line |
| 1 | 1 | 1 | Apply the first bit line forcing voltage to the bit line |
| 0 | 0 | 1 | Apply the programming bit line voltage to the bit line |

Bit line voltage setting phase $T_3$: the bit line voltage is set according to the data stored in each latch in Table 2. During bit line voltage setting phase $T_3$, signal Prech2 is low-level, and the second charge/discharge circuit can be used to set the voltage for the bit lines.

To set the bit line voltage, gate voltages $V_{blbias2}$ and $V_{blbias3}$ are applied to the gates of the bit line voltage setting circuits N5 and N17 to gradually increase the gate voltage from the ground voltage to $V_{mid1}+V_{th}$ and $V_{mid2}+V_{th}$ respectively and simultaneously.

When the verification result is the threshold voltage higher than the first verification voltage, the data in node DS of first latch 2312 is 1, the data in node D1 of the dynamic latch 2330 is 1, and the data in node D2 of the second latch 2322 is 0 (see Table 2).

At this time, QDS=0 and PMOS P1 is on, gate voltage $V_{blbias2}$ applied on N5 is $V_{mid1}+V_{th}$, the supply voltage passes through the first bit line voltage setting circuit N5. Thus the voltage of node SO2 is $(V_{mid1}+V_{th})-V_{th}$. The data of node D2 in second latch 2322 is 0, when the Prech2 is applied to conduct P4, the voltage of node SO node becomes $V_{dd}$, gate voltage $V_{blbias3}$ applied on N5 is $V_{mid2}+V_{th}$, the supply voltage passes through the second bit line voltage setting circuit N17. Thus, the voltage of node SO2 is $V_{mid2}$, because the bit line voltage has been set to the supply voltage $V_{dd}$ during the pre-charge phase and is prohibited from programming, so the bit line voltage is no longer affected by the voltage on node SO2.

When the verification result is the threshold voltage lower than the verification voltage and higher than the first sensing voltage, the data in node DS of first latch 2312 is 1, the data in node D1 of the dynamic latch 2330 is 1, and the data in node D2 of the second latch 2322 is 0 (see Table 2).

At this time, QDS=0 and PMOS P1 is on, gate voltage $V_{blbias2}$ applied on N5 is $V_{mid1}+V_{th}$, the supply voltage passes through the first bit line voltage setting circuit N5. Thus, the voltage of node SO2 is $(V_{mid1}+V_{th})-V_{th}=V_{mid1}$. The data of node D2 in second latch 2322 is 0; when the Prech2 is applied to conduct P4, the voltage of node SO node becomes $V_{dd}$, gate voltage $V_{blbias3}$ applied on N5 is $V_{mid2}+V_{th}$, the supply voltage passes through the second bit line voltage setting circuit N17. Thus, the voltage of node SO2 is $V_{mid2}$. Because $V_{mid2}$ (provided by the second charge/discharge circuit) is higher than $V_{mid1}$ (provided by the first charge/discharge circuit) and the bit line voltage has been set to the ground voltage $V_{ss}$ during the pre-charge phase, the bit line voltage is raised from the ground voltage (i.e., the programmed voltage) to $V_{mid2}$.

When the verification result is the threshold voltage lower than the verification voltage and higher than the first sensing voltage, the data in node DS of first latch 2312 is 1, the data in node D1 of the dynamic latch 2330 is 1, and the data in node D2 of the second latch 2322 is 1 (see Table 2).

At this time, QDS=0 and PMOS P1 is on, gate voltage $V_{blbias2}$ applied on N5 is $V_{mid1}+V_{th}$, the supply voltage passes through the first bit line voltage setting circuit N5. Thus, the voltage of node SO2 is $(V_{mid1}+V_{th})-V_{th}=V_{mid1}$. At this time, the voltage of node D2 is 1, and the voltage of node SO is the ground voltage. Because $V_{mid1}$ (provided by the first charge/discharge circuit) is higher than the ground voltage (provided by the second charge/discharge circuit) and the bit line voltage has been set to the ground voltage $V_{ss}$ during the pre-charge phase, the bit line voltage is changed to $V_{mid1}$.

When the verification result is the threshold voltage lower than the third verification voltage, the data in node DS of first latch 2312 is 0, the data in node D1 of the dynamic latch 2330 is 0, and the data in node D2 of the second latch 2322 is 1 (see Table 2).

The data of node QDS of the first latch 2312 is 1, NMOS tube N2 is turned on and coupled to the ground voltage, so the voltage of node SO2 still keeps at the ground voltage. When the voltage of node D2 is 1, the bit line voltage keeps at the ground voltage unchanged because the voltage of node SO is ground voltage, and the bit line voltage is set to ground voltage during the pre-charge phase.

In bit line voltage setting phase $T_3$, while setting the bit line voltage, the programming bit line voltage is applied to the selected word line and a pass voltage is applied to the unselected word line to perform the next programming operation on memory cell.

Figure 13:
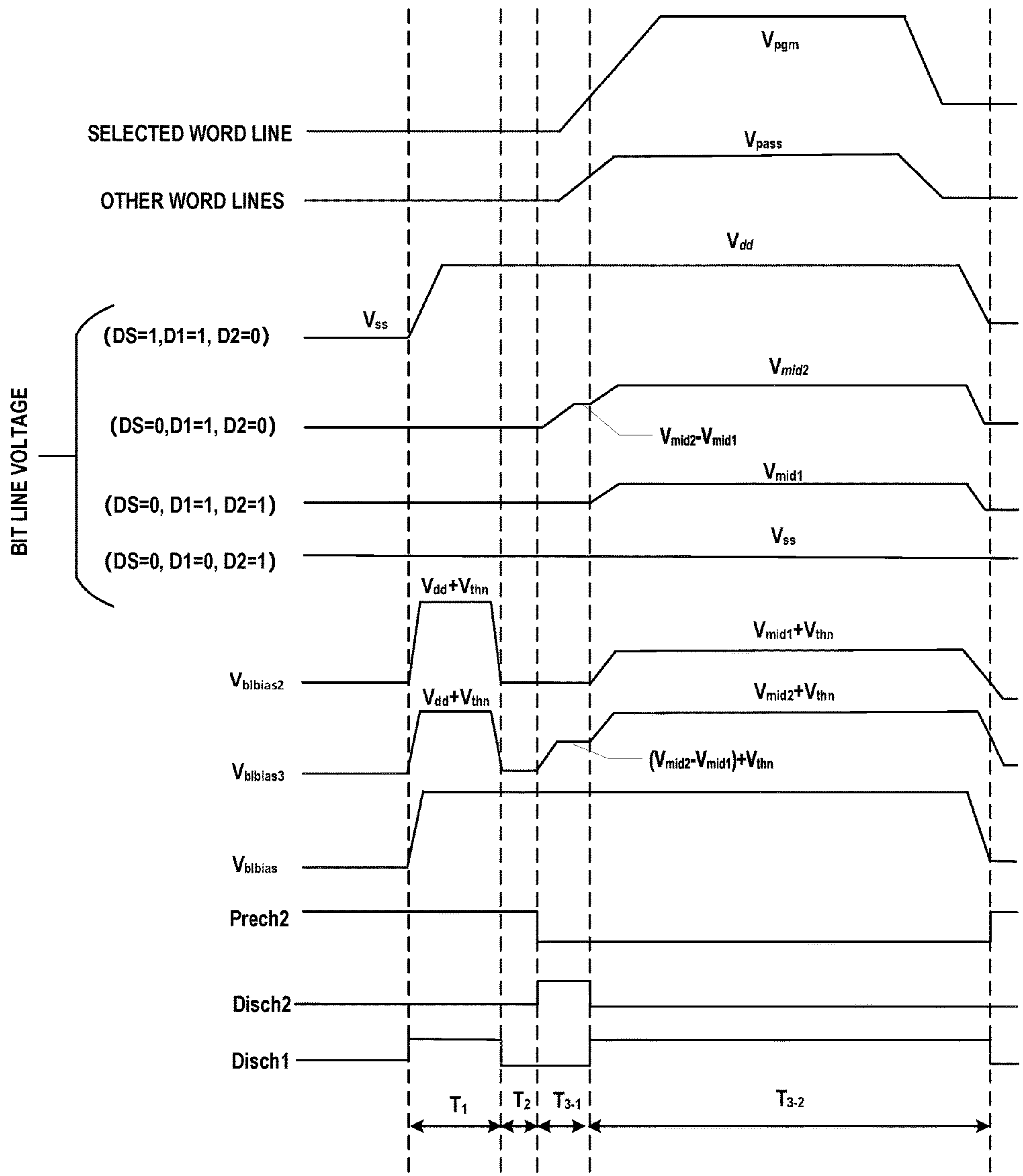
FIG. 13 illustrates a voltage chart of voltages applied to an exemplary memory device to set a voltage of a bit line, according to some aspects of the present disclosure.

Referring to FIG. 13, another implementation of the present disclosure is provided.

When the bit line voltage needs to be charged to $V_{mid2}$, i.e., when the verification results in a threshold voltage lower than the verification voltage and higher than or equal to the first sensing voltage, the bit line voltage setting phase $T_3$ can be divided into two stages: a first stage $T_{3-1}$ and a second stage $T_{3-2}$.

In stage $T_{3-1}$, the gate voltage of the second bit line voltage setting circuit N17 is charged into $V_{mid2}-V_{mid1}+V_{th}$, and the bit line is charged into $V_{mid2}-V_{mid1}$.

In stage $T_{3-1}$, the gate voltage $V_{blbias2}$ is charged into $(V_{mid1}+V_{th})-V_{th}$, the gate voltage $V_{blbias3}$ is charged from $V_{mid3}-V_{mid1}+V_{th}$ into $V_{mid2}+V_{th}$, the other configurations of the circuit are the same as the above-mentioned implementations.

The two-stage configuration makes a voltage increase of N5 and N17 are same or similar, i.e., the ramp voltage interval of N15 and N17 are the same or similar, when the gate voltage $V_{blbias2}$ of N5 is charged to $V_{mid1}+V_{th}$ and the gate voltage $V_{blbias3}$ of N17 is charged from $V_{mid3}-V_{mid1}+V_{th}$ to $V_{mid2}+V_{th}$, so that coupling between bit lines can be reduced.

The page buffer of the present disclosure exhibits one or more of the following advantages.

Firstly, the bit line voltage can be set to different levels while the sense node remains sensing capable.

Secondly, the bit line voltage setting phase can be divided into at least two stages to reduce the coupling between the bit lines by pre-charging the bit line voltage to different intermediate voltages.

Thirdly, at least one of the four bit line voltages can be selected accordingly during the programming process based on the verification results. The bit line voltage bias can be performed to narrow the threshold voltage distribution of MLC memory, especially in the case of TLC or QLC.

Fourthly, more bit line forcing voltages can be set by adding other data latching circuits, so that the target threshold voltage distribution of the memory cell becomes narrower until the programming needs are met.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A page buffer, comprising:

a first charge/discharge circuit coupled to a bit line and configured to store first bit line forcing information, and apply a first bit line forcing voltage to the bit line based on the first bit line forcing information; and a second charge/discharge circuit coupled to the bit line and configured to store a second bit line forcing information, and apply a second bit line forcing voltage, different from the first bit line forcing voltage, to the bit line based on the second bit line forcing information;

wherein the first bit line forcing voltage and the second bit line forcing voltage are both higher than a programming bit line voltage and lower than a programming-inhabit bit line voltage.

2. The page buffer of claim 1, wherein the first bit line forcing voltage is higher than the second bit line forcing voltage.

3. The page buffer of claim 1, wherein the first charge/discharge circuit comprises:

a first latch, coupled to the bit line through the page buffer and a first sense node coupled to a first charge/discharge circuit, configured to store the first bit line forcing information;

the first charge/discharge circuit, coupled to the bit line through the page buffer and a second sense node coupled to a first bit line voltage setting circuit, configured to drive a supply voltage to a first bit line voltage setting circuit; and the first bit line voltage setting circuit, coupled to the bit line through the second sense node and the first charge/discharge circuit, configured to drive the first bit line forcing voltage to the second sense node according to the first bit line forcing information.

4. The page buffer of claim 3, wherein the first charge/discharge circuit comprises a first charging switch, coupled to the supply voltage and the first bit line voltage setting circuit, configured to drive the supply voltage to the first bit line voltage setting circuit according to a signal output by the first latch; and a control terminal of the first charging switch is coupled to the first latch.

5. The page buffer of claim 3, wherein the first latch comprises:

a first data latching circuit configured to store verification information corresponding to a verified result, or to store the first bit line forcing information; and a first data setting circuit, coupled to the first data latching circuit, configured to send the verification information to be stored or the first bit line forcing information to be stored to the first data latching circuit.

6. The page buffer of claim 1, wherein the second charge/discharge circuit comprises:

a second latch, coupled to the bit line through a second charge/discharge circuit and a first sense node coupled to the page buffer, configured to store the second bit line forcing information;

the second charge/discharge circuit, coupled to the bit line through the page buffer and the first sense node coupled to a second bit line voltage setting circuit, configured to drive a supply voltage to a second bit line voltage setting circuit; and the second bit line voltage setting circuit, coupled to the bit line through the second charge/discharge circuit and a second sense node of the page buffer, configured to drive the second bit line forcing voltage to the second sense node according to the second bit line forcing information.

7. The page buffer of claim 6, wherein the second charge/discharge circuit comprises a second charging switch, coupled to the supply voltage and the second bit line voltage setting circuit, configured to drive the supply voltage to the second bit line voltage setting circuit according to a signal output by the second latch; and a control terminal of the second charging switch is coupled to the second latch.

8. The page buffer of claim 6, wherein the second latch comprises:

a second data latching circuit configured to store verification information corresponding to a verified result, or to store the second bit line forcing information; and a second data setting circuit, coupled to the second data latching circuit, configured to send the verification information to be stored or the second bit line forcing information to be stored to the second data latching circuit.

9. The page buffer of claim 1, wherein the first charge/discharge circuit is configured to store verification information and drive the programming bit line voltage to the bit line when the verification information allows programming; and the page buffer comprises a dynamic latch, coupled to a first sense node of the page buffer, configured to store and send the first bit line forcing information to the first charge/discharge circuit after the programming bit line voltage is applied to the bit line by the first charge/discharge circuit.

10. The page buffer of claim 9, wherein the dynamic latch comprises:

a third data latching circuit configured to store the first bit line forcing information; and a third data setting circuit, coupled to the third data latching circuit, configured to send the first bit line forcing information to the third data latching circuit.

11. The page buffer of claim 9, wherein the first charge/discharge circuit is configured to apply the programming-inhabit bit line voltage to the bit line when the verification information prohibits programming.

12. A memory device comprising:

a memory cell array comprising a plurality of memory cells and a plurality of bit lines coupled to the plurality of memory cells; and a peripheral circuit, coupled to the memory cell array, configured to control the memory cell array, the peripheral circuit comprising a page buffer;

wherein the page buffer comprises:

a first charge/discharge circuit coupled to one bit line of the plurality of bit lines and configured to store first bit line forcing information, and apply a first bit line forcing voltage to the bit line based on the first bit line forcing information; and a second charge/discharge circuit coupled to the bit line and configured to store a second bit line forcing information, and apply a second bit line forcing voltage, different from the first bit line forcing voltage, to the bit line based on the second bit line forcing information; and the first bit line forcing voltage and the second bit line forcing voltage are both higher than a programming bit line voltage and lower than a programming-inhabit bit line voltage.

13. A method for operating a memory device, comprising:

applying a first bit line forcing voltage to a bit line coupled to a memory cell to be programmed according to a first bit line forcing information stored in a first charge/discharge circuit;

applying a second bit line forcing voltage to the bit line according to second bit line forcing information stored in a second charge/discharge circuit; and programming the memory cell by the first bit line forcing voltage and/or the second bit line forcing voltage, wherein the first bit line forcing voltage and the second bit line forcing voltage are both higher than a programming bit line voltage and lower than a programming-inhabit bit line voltage.

14. The method of claim 13, wherein the first bit line forcing voltage is higher than the second bit line forcing voltage.

15. The method of claim 13, wherein applying a first bit line forcing voltage to the bit line comprises:

storing the first bit line forcing information in a first latch of the first charge/discharge circuit after performing a first bit line sensing voltage verification on the memory cell to be programmed;

applying a supply voltage to a first bit line voltage setting circuit of the first charge/discharge circuit through a first charge/discharge circuit of the first charge/discharge circuit; and applying the first bit line forcing voltage to a second sense node coupled to the bit line based on the supply voltage, according to the first bit line forcing voltage, by the first bit line voltage setting circuit.

16. The method of claim 15, wherein applying a supply voltage to a first bit line voltage setting circuit of the first charge/discharge circuit through a first charge/discharge circuit of the first charge/discharge circuit comprises:

applying the supply voltage to the first bit line voltage setting circuit by a first charging switch of the first charge/discharge circuit according to a signal sent by the first latch.

17. The method of claim 13, wherein applying a second bit line forcing voltage to the bit line comprises:

storing the second bit line forcing information in a second latch of the second charge/discharge circuit after performing a second bit line sensing voltage verification on the memory cell to be programmed;

applying a supply voltage to a second bit line voltage setting circuit of the second charge/discharge circuit through a second charge/discharge circuit of the second charge/discharge circuit; and applying the second bit line forcing voltage to a second sense node coupled to the bit line based on the supply voltage, according to the second bit line forcing voltage, by the second bit line voltage setting circuit.

18. The method of claim 17, wherein applying a supply voltage to a second bit line voltage setting circuit of the second charge/discharge circuit through a second charge/discharge circuit of the second charge/discharge circuit comprises:

applying the supply voltage to the second bit line voltage setting circuit by a second charging switch of the second charge/discharge circuit according to a signal sent by the second latch.

19. The method of claim 13 further comprising:

storing a verification information into the first charge/discharge circuit;

applying the programming bit line voltage to the bit line when the verification information allows programming; and sending the first bit line forcing information to the first charge/discharge circuit after providing the programming bit line voltage to the bit line by the first charge/discharge circuit.

20. The method of claim 19, further comprising:

providing the programming-inhabit bit line voltage to the bit line when the verification information prohibits programming.

* * * * *